(12) United States Patent
Stewart et al.

(10) Patent No.: US 11,600,654 B2
(45) Date of Patent: Mar. 7, 2023

(54) DETECTOR ARRAY YIELD RECOVERY

(71) Applicant: Allegro MicroSystems, LLC, Manchester, NH (US)

(72) Inventors: Logan G. Stewart, Portland, OR (US); Andrew S. Huntington, Banks, OR (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 134 days.

(21) Appl. No.: 17/376,607

(22) Filed: Jul. 15, 2021

(65) Prior Publication Data

US 2023/0017207 A1    Jan. 19, 2023

(51) Int. Cl.
*H01L 27/146*    (2006.01)

(52) U.S. Cl.
CPC ............... *H01L 27/14698* (2013.01)

(58) Field of Classification Search
CPC .................................................. H01L 27/14698
See application file for complete search history.

(56) References Cited

U.S. PATENT DOCUMENTS

| | | |
|---|---|---|
| 6,760,145 B1 | 7/2004 | Taylor et al. |
| 6,778,728 B2 | 8/2004 | Taylor et al. |
| 6,894,823 B2 | 5/2005 | Taylor et al. |
| 6,989,921 B2 | 1/2006 | Bernstein et al. |
| 7,015,780 B2 | 3/2006 | Bernstein et al. |
| 7,160,753 B2 | 1/2007 | Williams, Jr. |
| 7,432,537 B1 | 10/2008 | Huntington |
| 7,504,053 B1 | 3/2009 | Alekel |
| 7,764,719 B2 | 7/2010 | Munroe et al. |
| 7,782,911 B2 | 8/2010 | Munroe et al. |
| 7,852,549 B2 | 12/2010 | Alekel et al. |
| 7,885,298 B2 | 2/2011 | Munroe |
| 7,994,421 B2 | 8/2011 | Williams et al. |
| 8,207,484 B1 | 6/2012 | Williams |

(Continued)

FOREIGN PATENT DOCUMENTS

TW    201422772    6/2014

OTHER PUBLICATIONS

U.S. Appl. No. 17/197,314, filed Mar. 10, 2021, Taylor et al.

(Continued)

*Primary Examiner* — Seung C Sohn
(74) *Attorney, Agent, or Firm* — Daly, Crowley, Mofford & Durkee, LLP

(57) ABSTRACT

A method includes forming a plurality of identical arrays on a semiconductor wafer, each array having a plurality of detectors, screening each of the plurality of arrays to determine an operational status of each of the plurality of arrays, and selecting one of the plurality of arrays for use based on the determination of the operational status of the plurality of arrays. Also described is a focal plane array including a circuit having a plurality of electrical contacts and a die including a plurality of identical arrays, each including a plurality of detectors. The plurality of identical arrays includes at least one selected array that is fully functional and at least one non-selected array that is not fully functional and the selected array is positioned with respect to the circuit so that the detectors of the selected array contact the plurality of electrical contacts of the circuit.

28 Claims, 9 Drawing Sheets

(56) References Cited

U.S. PATENT DOCUMENTS

| | | |
|---|---|---|
| 8,319,307 B1 | 11/2012 | Williams |
| 8,525,287 B2 * | 9/2013 | Tian .................. H01L 31/09 257/457 |
| 8,570,372 B2 | 10/2013 | Russell |
| 8,597,544 B2 | 12/2013 | Alekel |
| 8,630,036 B2 | 1/2014 | Munroe |
| 8,630,320 B2 | 1/2014 | Munroe et al. |
| 8,730,564 B2 | 5/2014 | Alekel |
| 8,743,453 B2 | 6/2014 | Alekel et al. |
| 8,760,499 B2 | 6/2014 | Russell |
| 8,766,682 B2 | 7/2014 | Williams |
| 8,853,639 B2 | 10/2014 | Williams, Jr. |
| 9,121,762 B2 | 9/2015 | Williams et al. |
| 9,197,233 B2 | 11/2015 | Gaalema et al. |
| 9,269,845 B2 | 2/2016 | Williams et al. |
| 9,368,933 B1 | 6/2016 | Nijjar et al. |
| 9,397,469 B1 | 7/2016 | Nijjar et al. |
| 9,447,299 B2 | 9/2016 | Schut et al. |
| 9,451,554 B1 | 9/2016 | Singh et al. |
| 9,453,914 B2 * | 9/2016 | Stettner ................. G01S 17/18 |
| 9,466,745 B2 | 10/2016 | Williams et al. |
| 9,553,216 B2 | 1/2017 | Williams et al. |
| 9,591,238 B2 | 3/2017 | Lee et al. |
| 9,693,035 B2 | 6/2017 | Williams et al. |
| 9,759,602 B2 | 9/2017 | Williams |
| 9,804,264 B2 | 10/2017 | Villeneuve et al. |
| 9,810,775 B1 | 11/2017 | Welford et al. |
| 9,810,777 B2 | 11/2017 | Williams et al. |
| 9,810,786 B1 | 11/2017 | Welford et al. |
| 9,812,838 B2 | 11/2017 | Villeneuve et al. |
| 9,823,353 B2 | 11/2017 | Eichenholz et al. |
| 9,835,490 B2 | 12/2017 | Williams et al. |
| 9,841,495 B2 | 12/2017 | Campbell et al. |
| 9,843,157 B2 | 12/2017 | Williams |
| 9,847,441 B2 | 12/2017 | Huntington |
| 9,857,468 B1 | 1/2018 | Eichenholz et al. |
| 9,869,754 B1 | 1/2018 | Campbell et al. |
| 9,874,635 B1 | 1/2018 | Eichenholz et al. |
| 9,897,687 B1 | 2/2018 | Campbell et al. |
| 9,905,992 B1 | 2/2018 | Welford et al. |
| 9,923,331 B2 | 3/2018 | Williams |
| 9,941,433 B2 | 4/2018 | Williams et al. |
| 9,958,545 B2 | 5/2018 | Eichenholz et al. |
| 9,989,629 B1 | 6/2018 | LaChapelle |
| 9,995,622 B2 | 6/2018 | Williams |
| 10,003,168 B1 | 6/2018 | Villeneuve |
| 10,007,001 B1 | 6/2018 | LaChapelle et al. |
| 10,012,732 B2 | 7/2018 | Eichenholz et al. |
| 10,061,019 B1 | 8/2018 | Campbell et al. |
| 10,088,559 B1 | 10/2018 | Weed et al. |
| 10,094,925 B1 | 10/2018 | LaChapelle |
| 10,114,111 B2 | 10/2018 | Russell et al. |
| 10,121,813 B2 | 11/2018 | Eichenholz et al. |
| 10,139,478 B2 | 11/2018 | Gaalema et al. |
| 10,169,678 B1 | 1/2019 | Sachdeva et al. |
| 10,169,680 B1 | 1/2019 | Sachdeva et al. |
| 10,175,345 B2 | 1/2019 | Rhee et al. |
| 10,175,697 B1 | 1/2019 | Sachdeva et al. |
| 10,191,155 B2 | 1/2019 | Curatu |
| 10,209,359 B2 | 2/2019 | Russell et al. |
| 10,211,592 B1 | 2/2019 | Villeneuve et al. |
| 10,211,593 B1 | 2/2019 | Lingvay et al. |
| 10,217,889 B2 | 2/2019 | Dhulla et al. |
| 10,218,144 B2 | 2/2019 | Munroe et al. |
| 10,241,198 B2 | 3/2019 | LaChapelle et al. |
| 10,254,388 B2 | 4/2019 | LaChapelle et al. |
| 10,254,762 B2 | 4/2019 | McWhirter et al. |
| 10,267,898 B2 | 4/2019 | Campbell et al. |
| 10,267,899 B2 | 4/2019 | Weed et al. |
| 10,267,918 B2 | 4/2019 | LaChapelle et al. |
| 10,275,689 B1 | 4/2019 | Sachdeva et al. |
| 10,295,668 B2 | 5/2019 | LaChapelle et al. |
| 10,310,058 B1 | 6/2019 | Campbell et al. |
| 10,324,170 B1 | 6/2019 | Engberg, Jr. et al. |
| 10,324,185 B2 | 6/2019 | McWhirter et al. |
| 10,338,199 B1 | 7/2019 | McWhirter et al. |
| 10,338,223 B1 | 7/2019 | England et al. |
| 10,340,651 B1 | 7/2019 | Drummer et al. |
| 10,345,437 B1 | 7/2019 | Russell et al. |
| 10,345,447 B1 | 7/2019 | Hicks |
| 10,348,051 B1 | 7/2019 | Shah et al. |
| 10,386,489 B2 | 8/2019 | Albelo et al. |
| 10,394,243 B1 | 8/2019 | Ramezani et al. |
| 10,401,480 B1 | 9/2019 | Gaalema et al. |
| 10,401,481 B2 | 9/2019 | Campbell et al. |
| 10,418,776 B2 | 9/2019 | Welford et al. |
| 10,445,599 B1 | 10/2019 | Hicks |
| 10,451,716 B2 | 10/2019 | Hughes et al. |
| 10,473,788 B2 | 11/2019 | England et al. |
| 10,481,605 B1 | 11/2019 | Maila et al. |
| 10,488,496 B2 | 11/2019 | Campbell et al. |
| 10,491,885 B1 | 11/2019 | Hicks |
| 10,502,831 B2 | 12/2019 | Eichenholz |
| 10,503,172 B2 | 12/2019 | England et al. |
| 10,509,127 B2 | 12/2019 | England et al. |
| 10,514,462 B2 | 12/2019 | England et al. |
| 10,520,602 B2 | 12/2019 | Villeneuve et al. |
| 10,523,884 B2 | 12/2019 | Lee et al. |
| 10,535,191 B2 | 1/2020 | Sachdeva et al. |
| 10,539,665 B1 | 1/2020 | Danziger et al. |
| 10,545,240 B2 | 1/2020 | Campbell et al. |
| 10,551,485 B1 | 2/2020 | Maheshwari et al. |
| 10,551,501 B1 | 2/2020 | LaChapelle |
| 10,557,939 B2 | 2/2020 | Campbell et al. |
| 10,557,940 B2 | 2/2020 | Eichenholz et al. |
| 10,571,567 B2 | 2/2020 | Campbell et al. |
| 10,571,570 B1 | 2/2020 | Paulsen et al. |
| 10,578,720 B2 | 3/2020 | Hughes et al. |
| 10,591,600 B2 | 3/2020 | Villeneuve et al. |
| 10,591,601 B2 | 3/2020 | Hicks et al. |
| 10,606,270 B2 | 3/2020 | England et al. |
| 10,627,495 B2 | 4/2020 | Gaalema et al. |
| 10,627,512 B1 | 4/2020 | Hicks |
| 10,627,516 B2 | 4/2020 | Eichenholz |
| 10,627,521 B2 | 4/2020 | England et al. |
| 10,636,285 B2 | 4/2020 | Haas et al. |
| 10,641,874 B2 | 5/2020 | Campbell et al. |
| 10,663,564 B2 | 5/2020 | LaChapelle |
| 10,663,585 B2 | 5/2020 | McWhirter |
| 10,677,897 B2 | 6/2020 | LaChapelle et al. |
| 10,677,900 B2 | 6/2020 | Russell et al. |
| 10,684,360 B2 | 6/2020 | Campbell |
| 2018/0069367 A1 | 3/2018 | Villeneuve et al. |
| 2018/0284239 A1 | 10/2018 | LaChapelle et al. |
| 2018/0284240 A1 | 10/2018 | LaChapelle et al. |
| 2018/0284275 A1 | 10/2018 | LaChapelle |
| 2018/0284280 A1 | 10/2018 | Eichenholz et al. |
| 2019/0310368 A1 | 10/2019 | LaChapelle |

OTHER PUBLICATIONS

U.S. Appl. No. 17/197,328, filed Mar. 30, 2021, Taylor et al.
U.S. Appl. No. 17/230,253, filed Apr. 14, 2021, Judkins, III et al.
U.S. Appl. No. 17/230,276, filed Apr. 14, 2021, Cadugan.
U.S. Appl. No. 17/230,277, filed Apr. 14, 2021, Judkins, III et al.
U.S. Appl. No. 17/352,829, filed Jun. 21, 2021, Huntington et al.
U.S. Appl. No. 17/352,937, filed Jun. 21, 2021, Cadugan et al.
U.S. Appl. No. 17/376,607, filed Jul. 15, 2021, Stewart et al.
U.S. Appl. No. 17/400,300, filed Aug. 12, 2021, Myers et al.
U.S. Appl. No. 17/402,065, filed Aug. 13, 2021, Lee et al.

* cited by examiner

DETECTOR ARRAY YIELD RECOVERY

BACKGROUND

As is known in the art, some known ranging systems can include laser radar (ladar), light-detection and ranging (lidar, or LiDAR), and range-finding systems to measure the distance to objects in a scene. A laser ranging and imaging system emits pulses toward a particular location and measures the return echoes to extract ranges to objects at the location, from which a three-dimensional representation of the objects can be computed.

Time-of-flight laser ranging systems generally work by emitting a laser pulse and recording the time it takes for the laser pulse to travel to a target, reflect, and return to a photoreceiver. The laser ranging instrument records the time of the outgoing pulse and records the time that a laser pulse returns. The difference between these two times is the time of flight to and from the target. Using the speed of light, the round-trip time of the pulses is used to calculate the distance to the target.

Photoreceivers, such as a focal plane arrays (FPAs), can be used to detect signal returns. Photoreceivers can include an array of detector elements, or pixels (i.e., a detector array) and circuitry to process light incident on the detector array. Such photodetector arrays can include detectors, such as photodiodes, configured in arrays of various dimensions. Example photoreceiver circuitry can take the form of a Read Out Integrated Circuit (ROIC) or Application Specific Integrated Circuit (ASIC) as examples.

As is known in the art, detector arrays may be manufactured with some number of inoperable or out-of-specification detectors, or "bad" pixels, and the manufacturing yield of arrays that each contain only operable and in-specification detectors, or "good" pixels, may be lower than 100%. In arrays containing bad pixels, the presence of bad pixels prevents the acquisition of 100% of a scene in conventional detector systems. Some applications, particularly safety critical applications such as automotive applications, require all of the detectors of an array to be fully functional such that low manufacturing yield of arrays only containing good pixels is economically undesirable.

SUMMARY

Example embodiments of the disclosure provide methods and apparatus for recovering detector array yield relative to conventional one-array-per-die manufacturing. A plurality of identical detector arrays can be formed on a semiconductor wafer and screening can be performed in order to select a fully functional array from the plurality of arrays for use in a photoreceiver, such as a focal plane array. Detectors of the selected array can be electrically coupled to electrical contacts of a photoreceiver circuit, such as a Read Out Integrated Circuit (ROIC) or Application Specific Integrated Circuit (ASIC). With this arrangement, economic value of unused wafer area and detector array yield relative to conventional one-array-per-die manufacturing can be recovered by forming identical arrays in otherwise unused wafer space, in order to thereby improve the ability to select a fully functional array from amongst the identical arrays for use in a photoreceiver.

According to an aspect of the disclosure, a method includes forming a plurality of identical arrays on a semiconductor wafer, each array comprising a plurality of detectors, screening each of the plurality of arrays to determine an operational status of each of the plurality of arrays, and selecting one of the plurality of arrays for use based on the determination of the operational status of each of the arrays.

Features may include one or more of the following individually or in combination with other features. The operational status of each of the plurality of arrays can be a fully functional status or a not fully functional status. Detectors of each of the plurality of arrays can include one or more photodiodes, photoconductors, or avalanche photodiodes. The method may further include electrically coupling the selected array to a Read Out Integrated Circuit (ROIC) or an Application Specific Integrated Circuit (ASIC). Electrically coupling can include positioning the selected array relative to the ROIC or ASIC so that the plurality of detectors of the selected array contact a plurality of contacts of the ROIC or ASIC. The method may further include coupling at least a portion of an array that is not the selected array to one or more dummy contacts of the ROIC or ASIC. Each of the plurality of identical arrays can be a one-dimensional array. Each of the plurality of identical arrays can include non-adjacent detectors.

In embodiments, each detector of the arrays has a first terminal and a second terminal, wherein, within each array, the first terminal of each detector is coupled together at a common contact. Screening the arrays can include, for each array, applying a conductive layer to the array to electrically connect the second terminal of each of the plurality of detectors of the array together, applying a first probe to the conductive layer, applying a second probe to the common contact, and measuring impedance between the first probe and the second probe to determine the operational status of the array. The common contact can be a cathode contact. The conductive layer can comprise titanium. The method can further include removing the conductive layer from the array if the operational status is determined to be fully functional and leaving the conductive layer intact on the array if the operational status is determined to be non-fully functional. Removing the conductive layer can include laser cutting. In embodiments, selecting one of the plurality of arrays for use can include defining a boundary of a die based on the determination of the operational status of each of the plurality of arrays, wherein the selected array is supported by the die.

Also described is apparatus including a circuit comprising a plurality of electrical contacts and a semiconductor wafer comprising a plurality of identical arrays, each including a plurality of detectors, wherein the plurality of identical arrays comprises at least one selected array that is fully functional and at least one non-selected array that is not fully functional, and wherein the selected array is positioned with respect to the circuit so that the detectors of the selected array contact the plurality of electrical contacts of the circuit.

Features may include one or more of the following individually or in combination with other features. The circuit may be a ROIC or an ASIC. The detectors of each of the plurality of arrays may include one or more photodiodes, photoconductors, or avalanche photodiodes. The circuit may include one or more dummy contacts and wherein at least a portion of an array that is not the selected array is coupled to the one or more dummy contacts of the circuit. Each of the plurality of identical arrays may be a one-dimensional array. Each of the plurality of identical arrays may include non-adjacent detectors. The selected array may define a boundary of a die supporting the selected array.

According to a further aspect of the disclosure, a focal plane array can include a circuit having a plurality of electrical contacts and a die having a plurality of identical arrays, each including a plurality of detectors. The plurality of identical arrays can include at least one selected array that is fully functional and at least one non-selected array that is not fully functional, and the selected array can be positioned with respect to the circuit so that the detectors of the selected array contact the plurality of electrical contacts of the circuit.

Features may include one or more of the following individually or in combination with other features. The circuit may include a ROIC or an ASIC. The detectors of each of the plurality of arrays can include one or more photodiodes, photoconductors, or avalanche photodiodes. The circuit can include one or more dummy contacts and at least a portion of an array that is not the selected array can be coupled to the one or more dummy contacts of the circuit. Each of the plurality of identical arrays can be a one-dimensional array. Each of the plurality of identical arrays can include non-adjacent detectors.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1A:
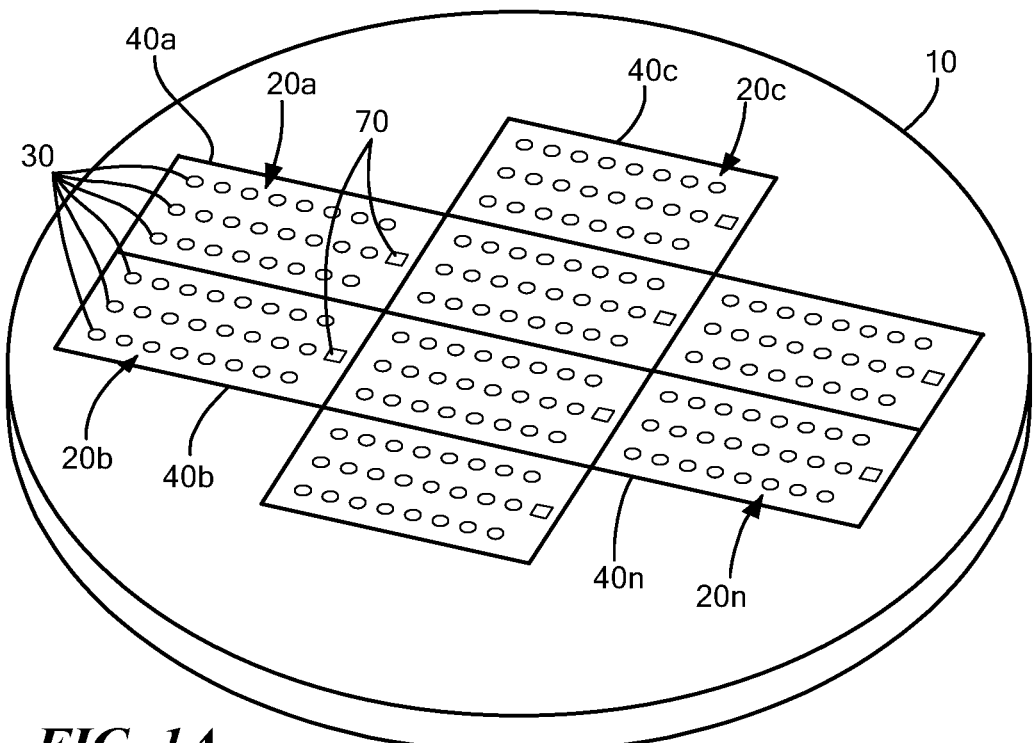
FIG. 1A shows a semiconductor wafer supporting a plurality of identical detector arrays.

Prior to describing example embodiments of the disclosure some information is provided. Laser ranging systems can include laser radar (ladar), light-detection and ranging (lidar), and rangefinding systems, which are generic terms for the same class of instrument that uses light to measure the distance to objects in a scene. This concept is similar to radar, except optical signals are used instead of radio waves. Similar to radar, a laser ranging and imaging system emits a pulse toward a particular location and measures the return echoes to extract the range.

Laser ranging systems generally work by emitting a laser pulse and recording the time it takes for the laser pulse to travel to a target, reflect, and return to a photoreceiver. The laser ranging instrument records the time of the outgoing pulse—either from a trigger or from calculations that use measurements of the scatter from the outgoing laser light—and then records the time that a laser pulse returns. The difference between these two times is the time of flight to and from the target. Using the speed of light, the round-trip time of the pulses is used to calculate the distance to the target.

Lidar systems may scan the beam across a target area to measure the distance to multiple points across the field of view, producing a full three-dimensional range profile of the surroundings. More advanced flash lidar cameras, for example, contain an array of detector elements, each able to record the time of flight to objects in their field of view.

When using light pulses to create images, the emitted pulse may intercept multiple objects, at different orientations, as the pulse traverses a 3D volume of space. The echoed laser-pulse waveform contains a temporal and amplitude imprint of the scene. By sampling the light echoes, a record of the interactions of the emitted pulse is extracted with the intercepted objects of the scene, allowing an accurate multi-dimensional image to be created. To simplify signal processing and reduce data storage, laser ranging and imaging can be dedicated to discrete-return systems, which record only the time of flight (TOF) of the first, or a few, individual target returns to obtain angle-angle-range images. In a discrete-return system, each recorded return corresponds, in principle, to an individual laser reflection (i.e., an echo from one particular reflecting surface, for example, a tree, pole or building). By recording just a few individual ranges, discrete-return systems simplify signal processing and reduce data storage, but they do so at the expense of lost target and scene reflectivity data. Because laser-pulse energy has significant associated costs and drives system size and weight, recording the TOF and pulse amplitude of more than one laser pulse return per transmitted pulse, to obtain angle-angle-range-intensity images, increases the amount of captured information per unit of pulse energy. All other things equal, capturing the full pulse return waveform offers significant advantages, such that the maximum data is extracted from the investment in average laser power. In full-waveform systems, each backscattered laser pulse received by the system is digitized at a high sampling rate (e.g., 500 MHz to 1.5 GHz). This process generates digitized waveforms (amplitude versus time) that may be processed to achieve higher-fidelity 3D images.

Of the various laser ranging instruments available, those with single-element photoreceivers generally obtain range data along a single range vector, at a fixed pointing angle. This type of instrument—which is, for example, commonly used by golfers and hunters—either obtains the range (R) to one or more targets along a single pointing angle or obtains the range and reflected pulse intensity (I) of one or more objects along a single pointing angle, resulting in the collection of pulse range-intensity data, $(R,I)_i$, where i indicates the number of pulse returns captured for each outgoing laser pulse.

More generally, laser ranging instruments can collect ranging data over a portion of the solid angle of a sphere, defined by two angular coordinates (e.g., azimuth and elevation), which can be calibrated to three-dimensional (3D) rectilinear cartesian coordinate grids; these systems are generally referred to as 3D lidar and ladar instruments. The terms "lidar" and "ladar" are often used synonymously and, for the purposes of this discussion, the terms "3D lidar," "scanned lidar," or "lidar" are used to refer to these systems without loss of generality. 3D lidar instruments obtain three-dimensional (e.g., angle, angle, range) data sets. Conceptually, this would be equivalent to using a rangefinder and scanning it across a scene, capturing the range of objects in the scene to create a multi-dimensional image. When only the range is captured from the return laser pulses, these instruments obtain a 3D data set (e.g., angle, angle, range)$_n$, where the index n is used to reflect that a series of range-resolved laser pulse returns can be collected, not just the first reflection.

Some 3D lidar instruments are also capable of collecting the intensity of the reflected pulse returns generated by the objects located at the resolved (angle, angle, range) objects in the scene. When both the range and intensity are recorded, a multi-dimensional data set [e.g., angle, angle, (range-intensity) n] is obtained. This is analogous to a video camera in which, for each instantaneous field of view (FOV), each effective camera pixel captures both the color and intensity of the scene observed through the lens. However, 3D lidar systems, instead capture the range to the object and the reflected pulse intensity.

Lidar systems can include different types of lasers, including those operating at different wavelengths, including those that are not visible (e.g., those operating at a wavelength of 840 nm or 905 nm), and in the near-infrared (e.g., those operating at a wavelength of 1064 nm or 1550 nm), and the thermal infrared including those operating at wavelengths known as the "eyesafe" spectral region (i.e., generally those operating at a wavelength beyond 1300-nm, which is blocked by the cornea), where ocular damage is less likely to occur. Lidar transmitters are generally invisible to the human eye. However, when the wavelength of the laser is close to the range of sensitivity of the human eye—roughly 350 nm to 730 nm—the light may pass through the cornea and be focused onto the retina, such that the energy of the laser pulse and/or the average power of the laser must be lowered to prevent ocular damage. Thus, a laser operating at, for example, 1550 nm, can—without causing ocular damage—generally have 200 times to 1 million times more laser pulse energy than a laser operating at 840 nm or 905 nm.

One challenge for a lidar system is detecting poorly reflective objects at long distance, which requires transmitting a laser pulse with enough energy that the return signal—reflected from the distant target—is of sufficient magnitude to be detected. To determine the minimum required laser transmission power, several factors must be considered. For instance, the magnitude of the pulse returns scattering from the diffuse objects in a scene is proportional to their range and the intensity of the return pulses generally scales with distance according to $1/R^4$ for small objects and $1/R^2$ for larger objects; yet, for highly-specularly reflecting objects (i.e., those reflective objects that are not diffusively-scattering objects), the collimated laser beams can be directly reflected back, largely unattenuated. This means that—if the laser pulse is transmitted, then reflected from a target 1 meter away—it is possible that the full energy (J) from the laser pulse will be reflected into the photoreceiver; but—if the laser pulse is transmitted, then reflected from a target 333 meters away—it is possible that the return will have a pulse with energy approximately $10^{12}$ Weaker than the transmitted energy. To provide an indication of the magnitude of this scale, the 12 orders of magnitude ($10^{12}$) is roughly the equivalent of: the number of inches from the earth to the sun, 10× the number of seconds that have elapsed since Cleopatra was born, or the ratio of the luminous output from a phosphorescent watch dial, one hour in the dark, to the luminous output of the solar disk at noon.

In many cases of lidar systems highly-sensitive photoreceivers are used to increase the system sensitivity to reduce the amount of laser pulse energy that is needed to reach poorly reflective targets at the longest distances required, and to maintain eyesafe operation. Some variants of these detectors include those that incorporate photodiodes, and/or offer gain, such as avalanche photodiodes (APDs) or single-photon avalanche detectors (SPADs). These variants can be configured as single-element detectors,-segmented-detectors, linear detector arrays, or area detector arrays. Using highly sensitive detectors such as APDs or SPADs reduces the amount of laser pulse energy required for long-distance ranging to poorly reflective targets. The technological challenge of these photodetectors is that they must also be able to accommodate the incredibly large dynamic range of signal amplitudes.

As dictated by the properties of the optics, the focus of a laser return changes as a function of range; as a result, near objects are often out of focus. Furthermore, also as dictated by the properties of the optics, the location and size of the "blur"—i.e., the spatial extent of the optical signal—changes as a function of range, much like in a standard camera. These challenges are commonly addressed by using large detectors, segmented detectors, or multi-element detectors to capture all of the light or just a portion of the light over the full-distance range of objects. It is generally advisable to design the optics such that reflections from close objects are blurred, so that a portion of the optical energy does not reach the detector or is spread between multiple detectors. This design strategy reduces the dynamic range requirements of the detector and prevents the detector from damage.

Acquisition of the lidar imagery can include, for example, a 3D lidar system embedded in the front of car, where the 3D lidar system, includes a laser transmitter with any necessary optics, a single-element photoreceiver with any necessary dedicated or shared optics, and an optical scanner used to scan ("paint") the laser over the scene. Generating a full-frame 3D lidar range image—where the field of view is 20 degrees by 60 degrees and the angular resolution is 0.1 degrees (10 samples per degree)—requires emitting 120,000 pulses [(20*10*60*10)=120,000)].

When update rates of 30 frames per second are required, such as is required for automotive lidar, roughly 3.6 million pulses per second must be generated and their returns captured.

There are many ways to combine and configure the elements of the lidar system—including considerations for the laser pulse energy, beam divergence, detector array size and array format (single element, linear, 2D array), and scanner to obtain a 3D image. If higher power lasers are deployed, pixelated detector arrays can be used, in which case the divergence of the laser would be mapped to a wider field of view relative to that of the detector array, and the laser pulse energy would need to be increased to match the proportionally larger field of view. For example— compared to the 3D lidar above—to obtain same-resolution 3D lidar images 30 times per second, a 120,000-element detector array (e.g., 200×600 elements) could be used with a laser that has pulse energy that is 120,000 times greater. The advantage of this "flash lidar" system is that it does not require an optical scanner; the disadvantages are that the larger laser results in a larger, heavier system that consumes more power, and that it is possible that the required higher pulse energy of the laser will be capable of causing ocular damage. The maximum average laser power and maximum pulse energy are limited by the requirement for the system to be eyesafe.

As noted above, while many lidar system operate by recording only the laser time of flight and using that data to obtain the distance to the first target return (closest) target, some lidar systems are capable of capturing both the range and intensity of one or multiple target returns created from each laser pulse. For example, for a lidar system that is capable of recording multiple laser pulse returns, the system can detect and record the range and intensity of multiple returns from a single transmitted pulse. In such a multi-pulse lidar system, the range and intensity of a return pulse from a closer-by object can be recorded, as well as the range and intensity of later reflection(s) of that pulse—one(s) that moved past the closer-by object and later reflected off of more-distant object(s). Similarly, if glint from the sun reflecting from dust in the air or another laser pulse is detected and mistakenly recorded, a multi-pulse lidar system allows for the return from the actual targets in the field of view to still be obtained.

The amplitude of the pulse return is primarily dependent on the specular and diffuse reflectivity of the target, the size of the target, and the orientation of the target. Laser returns from close, highly-reflective objects, are many orders of magnitude greater in intensity than the intensity of returns from distant targets. Many lidar systems require highly sensitive photodetectors, for example APDs, which along with their CMOS amplification circuits may be damaged by very intense laser pulse returns.

For example, if an automobile equipped with a front-end lidar system were to pull up behind another car at a stoplight, the reflection off of the license plate may be significant— perhaps 10^12 higher than the pulse returns from targets at the distance limits of the lidar system. When a bright laser pulse is incident on the photoreceiver, the large current flow through the photodetector can damage the detector, or the large currents from the photodetector can cause the voltage to exceed the rated limits of the CMOS electronic amplification circuits, causing damage. For this reason, it is generally advisable to design the optics such that the reflections from close objects are blurred, so that a portion of the optical energy does not reach the detector or is spread between multiple detectors.

However, capturing the intensity of pulses over a larger dynamic range associated with laser ranging may be challenging because the signals are too large to capture directly. One can infer the intensity by using a recording of a bit-modulated output obtained using serial-bit encoding obtained from one or more voltage threshold levels. This technique is often referred to as time-over-threshold (TOT) recording or, when multiple-thresholds are used, multiple time-over-threshold (MTOT) recording.

Referring to FIGS. 1A-1E, detector array screening is illustrated whereby detector arrays are evaluated to assess their suitability for use. For example, in some applications suitability for use can require 100% fully functional arrays containing 100% fully functional detectors. Thus, screening can be used to determine whether a detector array is fully functional (i.e., 100% functional) or not fully functional (i.e., less than 100% functional). Functionality of a detector array can be assessed based on various properties of detectors comprising the arrays, such as detector impedance, as will be described. In embodiments, "full functionality" can mean that all of the array detectors meet a predetermined requirement, such as not being shorted. It will be appreciated by those of ordinary skill in the art that detectors meeting such a requirement may, nevertheless have other characteristics rendering them otherwise out of specification; however, herein, the term "fully functional" and "100% functional" shall refer interchangeably to detectors and arrays that meet a predetermined requirement such as detectors not being shorted and arrays not containing any shorted detectors. Detector array screening can be performed in a manufacturing setting before suitable (e.g., fully functional) detector arrays are selected for, and put into use in a photoreceiver.

Detector array screening according to the disclosure can include applying a conductive layer to a detector array, electrically contacting the conductive layer with a first probe, electrically contacting a common contact of the detectors of the array with a second probe, and measuring impedance between the first probe and the second probe to determine the operational status of the array. In embodiments, the operational status can be a fully functional status (e.g., none of the detectors are shorted) or a not fully functional status (e.g., one or more detectors is/are shorted).

FIG. 1A shows an example semiconductor wafer 10 supporting a plurality of detector arrays 20a-20n. Semiconductor wafer 10 can comprise any suitable material in which detectors can be formed. Example wafer materials can include silicon, germanium, gallium arsenide, indium phosphide, indium gallium arsenide, and indium aluminum arsenide, etc.

Each of arrays 20a-20n contains a plurality of detector elements, or simply detectors 30. In general, detectors 30 are elements or devices that convert light into an electrical signal (e.g., current or voltage). It will be appreciated by those of ordinary skill in the art that the detectors 30 can be formed in layers of the semiconductor wafer 10 that are not visible and/or accessible from the illustrated surface of the wafer. The circles to which reference character 30 points can be bump pads, or bond pads and serve the function of permitting electrical contact to be made between the detector and circuitry in an application system, such as a photoreceiver.

Detector arrays 20a-20n contain a plurality of individual detectors 30 arranged in a pattern designed to suit needs of a particular application. For example, although the detectors 30 are equally spaced within each array 20a-20n, such spacing is not required and can be tailored to the intended application.

Detectors 30 within a respective array 20a-20n may or may not be identical to each other; however, according to an aspect of the disclosure, each of the arrays 20a-20n are identical to each other. Detectors 30 can take various forms, such as photodiodes, photoconductors, or avalanche photodiodes.

In embodiments, each detector 30 has a first terminal and a second terminal and, within each array 20a-20n, the first terminal of each detector is coupled together at a common contact 70. Such a common contact 70 can be a cathode contact and can be electrically coupled to a continuous buried sheet of cathode material as explained below in connection with FIG. 1E. The second terminal of detectors 30 can be accessible through the illustrated bump pads.

Example arrays 20a-20n are 3×8 arrays. However, it will be appreciated by those of ordinary skill in the art that detector arrays 20a-20n can have various patterns and dimensions to suit a particular application.

Boundaries 40a-40n between arrays 20a-20n, respectively, can depict die boundaries, or lines along which the semiconductor wafer 10 is diced to form individual die, each supporting a respective array 20a-20n. Thus, reference characters 40a-40n pointing to die boundaries can be used interchangeably to likewise refer to the resulting die.

Although the example of FIGS. 1A-1E has each die 40a-40n containing a single respective array 20a-20n, it will be appreciated by those of ordinary skill in the art that other configurations are possible, such as configurations in which a single die supports more than one array (e.g., FIGS. 2A-2E).

Figure 1B:
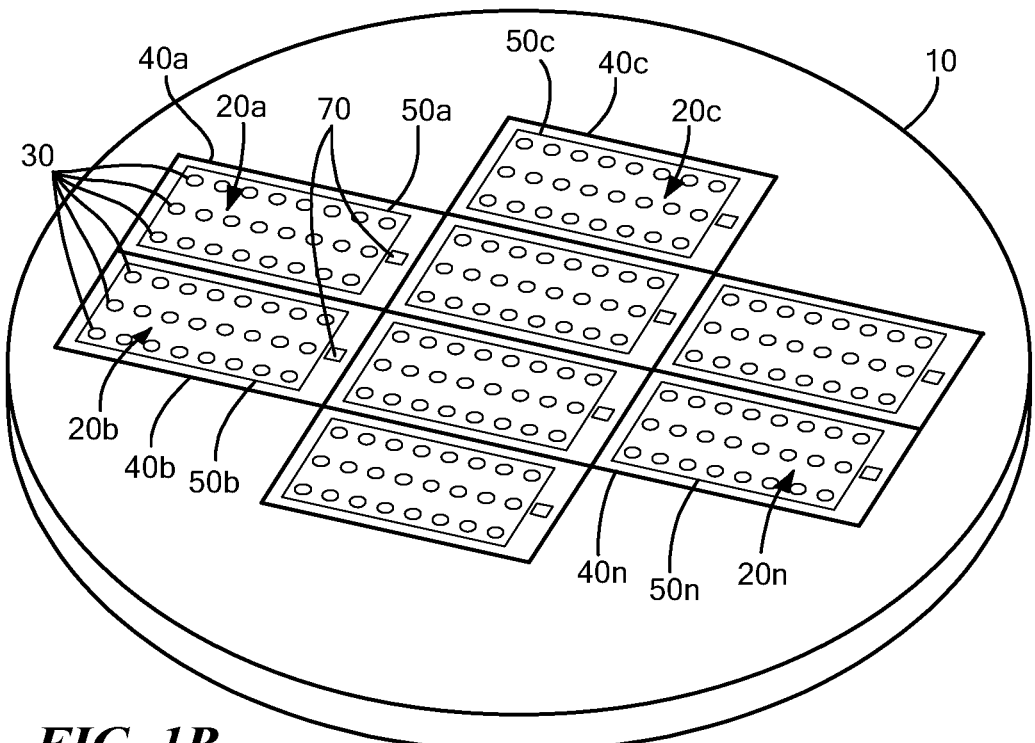
FIG. 1B shows the semiconductor wafer of FIG. 1A with a conductive layer applied to each of the detector arrays.

FIG. 1B illustrates the semiconductor wafer 10 with a conductive layer 50a-50n applied to each of the detector arrays 20a-20n, respectively. Various techniques can be used to apply the conductive layers 50a-50n, such as photolithographic patterning of an evaporated or sputtered conductive layer, such as a metal. Conductive layers 50a-50n serve to electrically couple the detectors 30 of each array in parallel by electrically connecting the second terminals of the detectors together, given that the first terminals of the detectors are electrically coupled together by the common contact. In other words, by contacting the bump pads 30 of each of the detectors of an array with a conductive layer, the second terminals of each of the detectors are electrically coupled together.

Various materials are suitable for conductive layers 50a-50n. As one example, the conductive layers 50a-50n can be comprised of titanium because generally titanium can be easily removed, the advantage of which will become apparent below. In general, the conductive layer material can be selected based on various factors including, but not limited to its conductive properties, its use as a standard material for other purposes in the semiconductor wafer process so it does not require special development to deposit and pattern, and that it can be easily removed without harming the underlying layers or interfering with subsequent wafer processing.

Figure 1C:
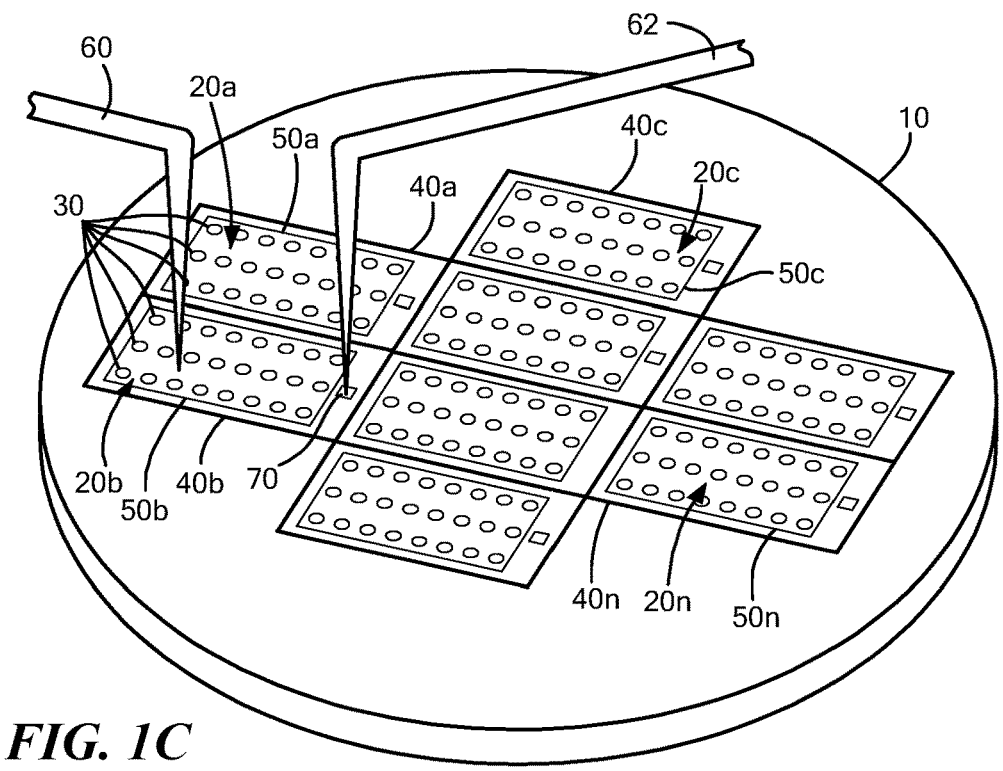
FIG. 1C illustrates screening of the detector arrays of FIG. 1B.

Referring to FIG. 1C, and as illustrated with respect to example array 20b, test probes 60, 62 are brought into contact with the array by positioning one probe 60 to electrically contact the conductive layer 50b and the other probe 62 to electrically contact the common contact. There are various ways to achieve this ultimate probe electrical contact. FIG. 1C shows a simplified scheme in which the probe 60 is brought into physical contact with the conductive layer 50b itself and probe 62 is brought into physical contact with the common contact 70. FIG. 1E illustrates additional optional detail (not shown in the simplified view of FIG. 1C) in which electrical contact can be made to the conductive layer 50b with a specialized continuity pad and electrical contact can be made to the common contact with a specialized continuity pad, as will be explained. FIG. 1E further illustrates a manner of electrical connection of the common contact 70 to a buried cathode layer.

With probes 60, 62 positioned as shown, an impedance measurement can be made by test equipment coupled to the probes 60, 62. Given that the detectors 30 of the array 20b are coupled in parallel, an impedance measurement of less than a predetermined threshold can indicate that one or more detectors of the array 20b are faulty (i.e., that the array is not 100% or fully functional since one or more detectors is/are shorted); whereas an impedance measurement of greater than the predetermined threshold can indicate that all of the detectors of the scanned array 20b are likely operational (i.e., that no detectors within the array are shorted). As noted above, within the nomenclature of this disclosure, an array with no detectors shorted can be referred to as 100% functional or fully functional.

With the detector pixels coupled in parallel by the conductive layer, a determination can be made as to whether the array is or is not fully functional using a single continuity measurement. This arrangement is in contrast to conventional array screening methods (i.e., without use of a conductive layer 50a-50n) in which potentially thousands of detectors are individually measured in order to assess the functionality of a detector array.

The impedance measurement illustrated in FIG. 1C in connection with array 20b can be repeated for each of the remaining arrays 20b-20n in order to thereby determine the operational status of each array. In this way, each array 20a-20n can be "passed" or "failed." Based on the determination, one or more of the detector arrays 20a-20n can be selected for use. With the described screening, detector arrays for which the operable pixel yield is required to be 100% can be rapidly screened at the wafer level in order to thereby reject arrays containing shorted pixels.

Figure 1D:
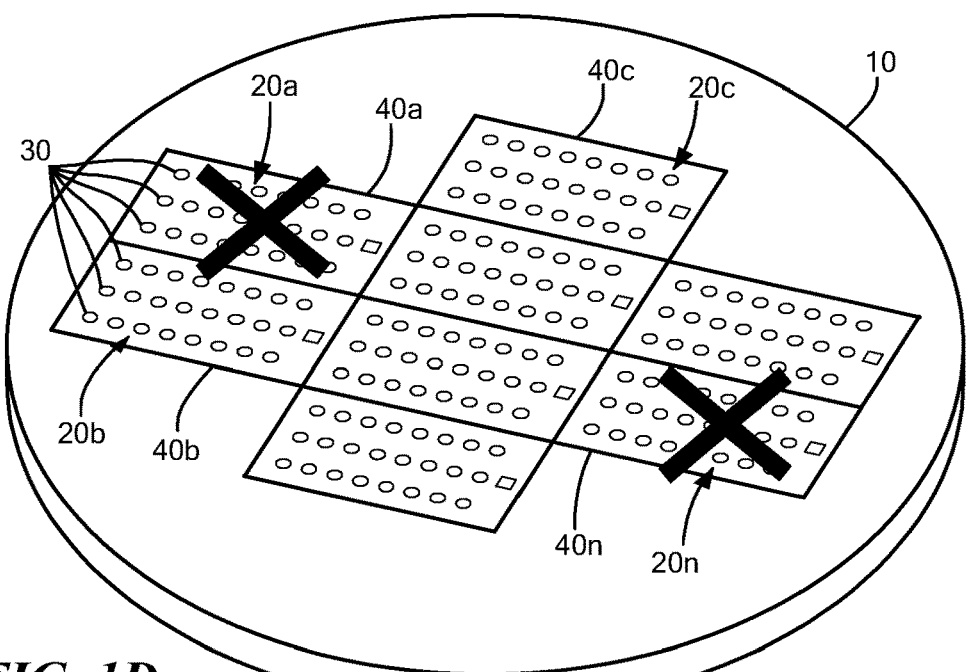
FIG. 1D shows example results of the screening of FIG. 1C.
Figure 1E:
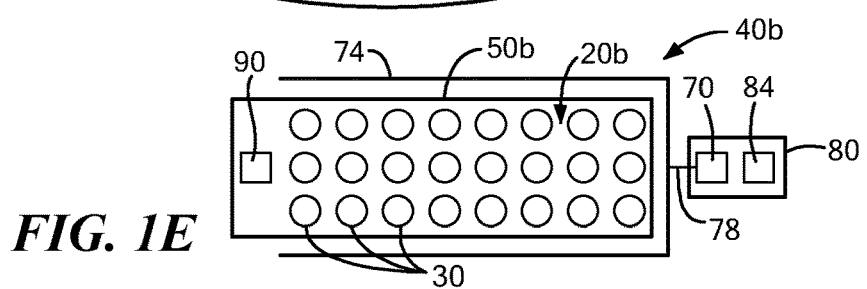
FIG. 1E is a detailed plan view of a die of FIG. 1C.

Referring also to FIG. 1D, example results of the detector array screening are shown. As represented by "X", detector arrays 20a and 20n are, in the example, determined not to be fully functional (e.g., contain one or more shorted pixels) and the other arrays are determined to be fully functional (e.g., do not contain any shorted pixels).

Also shown in FIG. 1D is removal of the conductive layers 50a-50n from respective arrays 20a-20n. Following screening of the arrays 20a-20n, the conductive layer 50a-50n associated with one or more arrays determined to be fully functional can be removed in order to prepare the array for subsequent use. In other words, following screening, wafer 10 can be diced and die 20a and 20n can be discarded and the remaining die can be coupled to circuits and systems to suit the application.

Various techniques can be used to remove the conductive layer 50a-50n as is further discussed below in connection with FIG. 2D. For example, the conductive layer 50a-50n can be removed by etching if this process does not attack, or at least does not significantly attack, the underlying material. For instance, titanium can be etched by chemicals formulated not to significantly attack silicon dioxide, silicon nitride, or gold, and it may be the case that the surface of the detector wafer comprises gold contact pads embedded in a silicon dioxide or nitride surface passivation layer. There are also material-selective dry etches that might remove the conductive material without disturbing, or at least without significantly disturbing, the underlying materials. If it is desired to remove the conductive layers 50a-50n from the entire wafer 10, the wafer can be placed into a chemical solution, or etchant, such as an acid solution, or a basic solution which may include other chemicals that attacks the conductive layer and then is rinsed off. It is also possible to use laser cutting to electrically disconnect the conducive layer.

Although the conductive layers 50a, 50n are also shown to be removed from the arrays that are determined not to be fully functional (i.e., arrays 20a, 20n), this removal is not required. Referring also to FIG. 1E, optional additional detail in an example die 40b is shown. A ring contact 74 can be formed just outside the perimeter of the detector active area and rest on the common cathode layer of the wafer 10.

The ring contact 74 can be routed by a metal trace 78 to cathode bump pad 70 positioned to the side of the pixel array. A specialized cathode continuity pad 84 can be electrically coupled to the pad 70 by a conductive layer 80, as shown. With this configuration, the common cathode can be probed at the specialized pad 84 (i.e., probe 62 can be brought into contact with continuity pad 84). Further, a specialized continuity pad 90 can be provided with which electrical connection can be made to the second terminal of the detectors 30 that are electrically connected together by the conductive layer 50*b*. Thus, the second terminal, or anode of the detectors can be probed at the specialized pad 90 (i.e., probe 60 can be brought into contact with continuity pad 90).

Use of specialized continuity pads 90, 84 that are positioned outside of the active area of the array and configured to be contacted by probes 60, 62, respectively, enables array screening without directly probing the relatively delicate bump pads of the detectors 30. In this way, advantageously, probe damage to pads 30, 70 that are needed to interconnect the array to a photoreceiver circuit, or other circuit can be avoided. Damaged detector bump pads can cause open connections when a detector array is later coupled to a photoreceiver circuit.

Referring to FIGS. 2A-2E, a semiconductor wafer 200 supports a plurality of detector arrays 230*a*-230*n*, 240*a*-240*n*, and 250*a*-250*n*. In the example of FIGS. 2A-2D, boundaries 220*a*-220*n* can depict or define individual semiconductor die (once the wafer 200 is diced). Thus, reference characters 220*a*-220*n* can be used interchangeably to refer to boundaries between die or simply die.

Wafer 200 can differ from wafer 10 (FIG. 1) in that each die 220*a*-220*n* contains a plurality of identical detector arrays 230*a*, 240*a*, 250*a*-230*n*, 240*n*, 250*n*; whereas each die 40*a*-40*n* supported by wafer 10 contains only a single detector array 20*a*-20*n*. For example, die 220*a* contains detector arrays 230*a*, 240*a*, 250*a*, die 220*b* contains detector arrays 230*b*, 240*b*, 250*b*, and die 220*n* contains detector arrays 230*n*, 240*n*, 250*n*. In other ways, such as material, wafer 200 can be the same as or similar to wafer 10 of FIG. 1A.

Each array 230*a*-230*n*, 240*a*-240*n*, 250*a*-250*n* contains a plurality of detector elements, or simply detectors 260. Here again, the circles to which reference character 260 points can be bump pads and serve the function of permitting electrical contact to be made between the detector and circuitry in an application system, such as a photoreceiver.

Detectors 260 may or may not be identical to each other; however, according to an aspect of the disclosure, on a given die 220*a*-220*n*, each of the arrays 230*a*-230*n*, 240*a*-240*n*, 250*a*-250*n* is identical to each other. Detectors 260 can take various forms, such as photodiodes, photoconductors, or avalanche photodiodes.

In embodiments, each detector 260 has a first terminal and a second terminal and, within each array, the first terminal of each detector is coupled together at a common contact as can be a cathode contact and take the form of a continuous buried sheet of cathode material. The second terminal of detectors 260 can be accessible through the illustrated bump pads.

Example arrays 230*a*-230*n*, 240*a*-240*n*, 250*a*-250*n* are each 1×9 arrays. It will be appreciated by those of ordinary skill in the art however, that each array 230*a*-230*n*, 240*a*-240*n*, 250*a*-250*n* can have various patterns and dimensions to suit a particular application.

Conventionally, in certain high aspect ratio array formats, such as one-dimensional linear arrays, wafer area is inefficiently used because mechanical strength requirements necessitate that the detector array die be wider along the short axis of the die than is necessary to fit the detector pixels. When yield of arrays with 100% operable pixels is low, according to the disclosure, the economic value of the unused wafer area can be recovered relative to conventional one-array-per-die manufacturing by forming additional pixel array copies in the unused space, and screening as above to find an array copy with 100% functional pixels among the several produced, for hybridization to a photoreceiver circuit. Stated differently, by forming a plurality of identical detector arrays on a single die (that would otherwise, conventionally contain only a single array but that would conventionally have the same dimensions for mechanical strength reasons), detector array yield can be improved by increasing the likelihood of a fully functional array being amongst the identical arrays. Further, the economic value of unused wafer area can be recovered relative to conventional one-array-per-die manufacturing by forming identical arrays in otherwise unused wafer space. These advantages are particularly significant in linear array configurations having common cathode connections at the ends of the array, rather than alongside the array pixels since this configuration facilitates the formation of multiple detector array copies offset along the short axis of the array.

Arrays 230*a*-230*n*, 240*a*-240*n*, 250*a*-250*n* include access in the form of a pad 270 to the common contact between the first terminals of each of the detectors 260. Thus, in embodiments, pad 270 can be electrically coupled to the common cathode layer. Within a given die (e.g., die 220*a*), pads 270 may be coupled to the same common cathode buried layer or to separate such layers, with each common cathode layer associated with a respective array (e.g., arrays 230*a*, 240*a*, 250*a*).

Figure 2A:
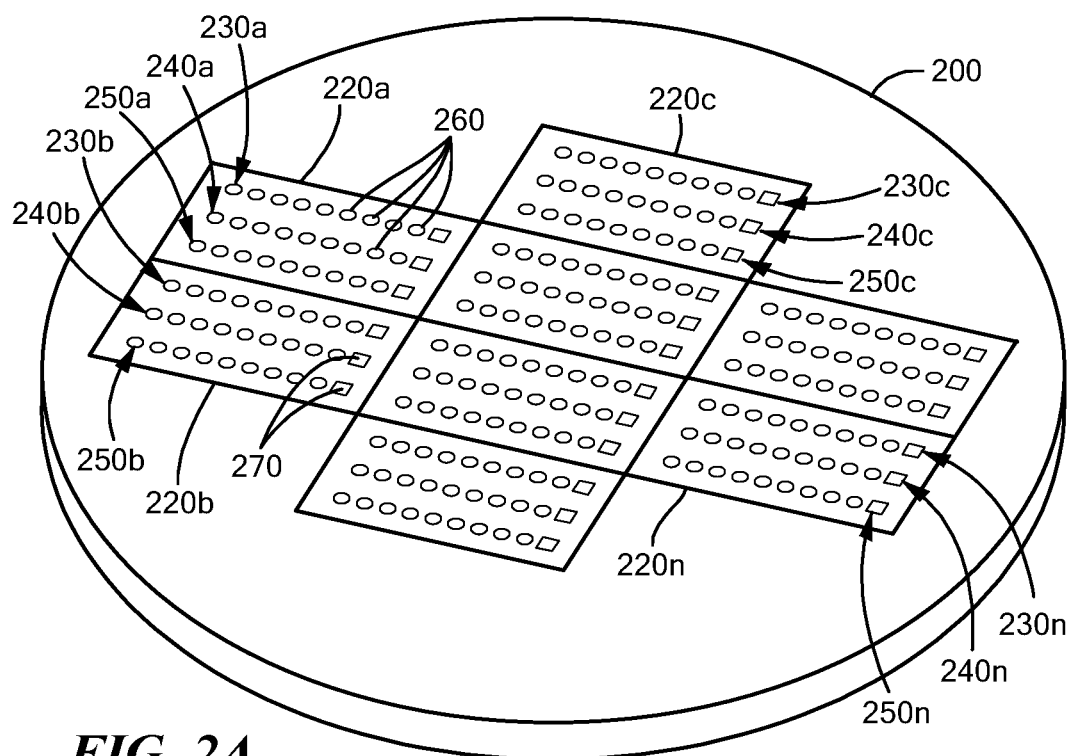
FIG. 2A shows a semiconductor wafer supporting an alternative plurality of identical detector arrays.
Figure 2B:
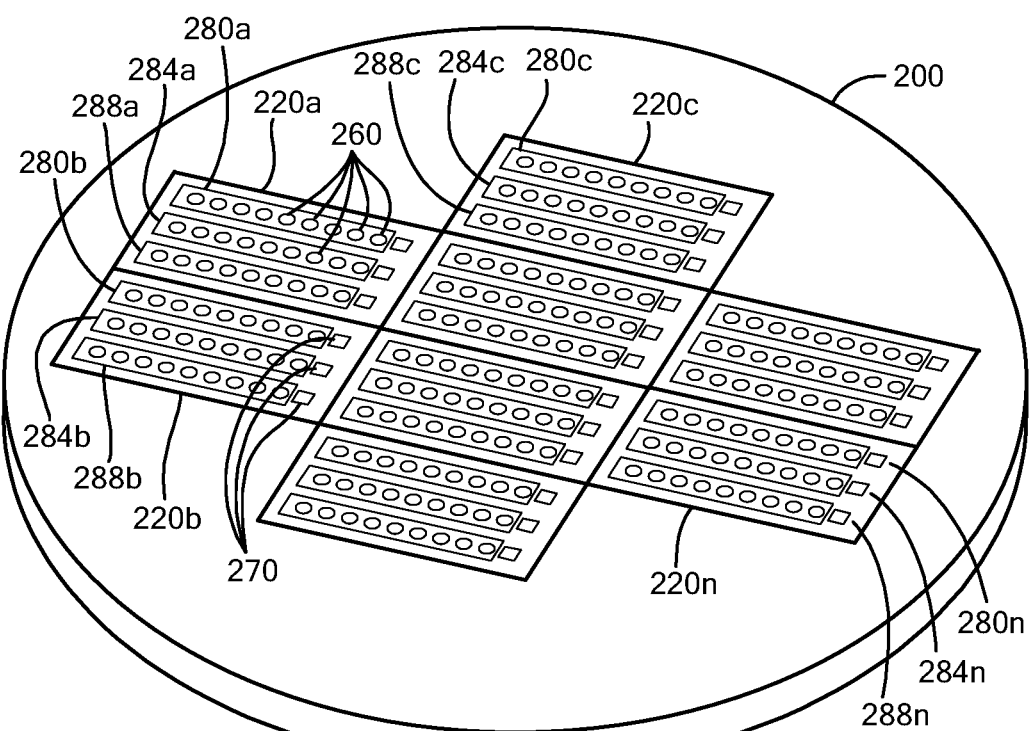
FIG. 2B shows the semiconductor wafer of FIG. 2A with a conductive layer applied to each of the detector arrays.

Referring also to FIG. 2B, conductive layers 280*a*-280*n*, 284*a*-284*n*, 288*a*-288*n* are applied to each of the detector arrays 230*a*-230*n*, 240*a*-240*n*, 250*a*-250*n* of each of the die 220*a*-220*n*, respectively. Conductive layers 280*a*-280*n*, 284*a*-284*n*, 288*a*-288*n* can be the same as or similar to layers 50*a*-50*n* of FIG. 1 and serve to couple the detectors 260 of the respective array in parallel by electrically connecting the second terminals of the detectors together, given that the first terminals of the detectors are electrically coupled together by the common contact. In other words, by contacting the bump pads 260 of each of the detectors of an array with a conductive layer, the second terminals of each of the detectors are electrically coupled together.

Figure 2C:
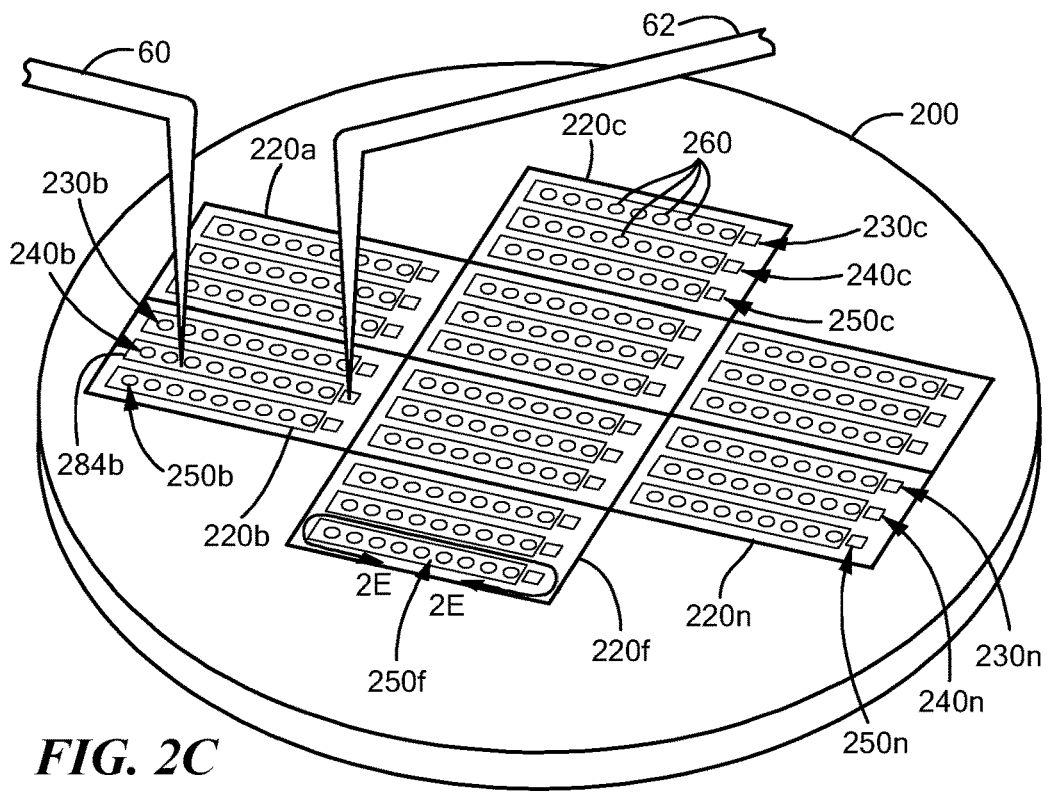
FIG. 2C illustrates screening of the detector arrays of FIG. 2B.

Referring to FIG. 2C, and as illustrated with respect to example array 240*b*, test probes 60, 62 are brought into contact with the array by positioning one probe 60 to electrically contact the conductive layer 284*b* and the other probe 62 to electrically contact the common contact 270. There are various ways to achieve this ultimate probe electrical contact. FIG. 2C shows a simplified scheme in which the probe 60 is brought into physical contact with the conductive layer 284*b* itself and probe 62 is brought into physical contact with the common contact 270. FIG. 2E illustrates additional optional detail (not shown in the simplified view of FIG. 2C) in which electrical contact can be made to the conductive layer 284*b* with a specialized continuity pad and electrical contact can be made to the common contact with a specialized continuity pad, as will be explained. FIG. 2E further illustrates a manner of electrical connection of the common contact 270 to a buried cathode layer.

With probes 60, 62 positioned as shown, an impedance measurement can be made by test equipment coupled to the probes. Given that the detectors 260 of the array 240b are coupled in parallel, an impedance measurement of less than a predetermined threshold can indicate that one or more detectors of the array 240b are faulty (i.e., that the array is not 100% or fully functional since one or more detectors is/are shorted); whereas an impedance measurement of greater than the predetermined threshold can indicate that all of the detectors of the scanned array 240b are likely operational (i.e., that no detectors within the array are shorted).

With the detector pixels 260 coupled in parallel by the conductive layer, a determination can be made as to whether the array 240b is or is not fully functional using a single continuity measurement. This arrangement is in contrast to conventional array screening methods (i.e., without use of conductive layers 280a-280n, 284a-284n, 288a-288n) in which potentially thousands of detectors are individually measured in order to assess the functionality of a detector array.

The impedance measurement illustrated in FIG. 2C in connection with array 240b and described above can be repeated for each of the remaining arrays 230a-230n, 240a, 240c-240n, 250b-250n in order to thereby determine the operational status of each array. In this way, each array 230a-230n, 240a-240n, 250a-250n can be "passed" or "failed." Based on the determination, one or more of the detector arrays 230a-230n, 240a-240n, 250a-250n can be selected for use. With the described screening, detector arrays for which the operable pixel yield is required to be 100% can be rapidly screened at the wafer level in order to thereby reject those arrays containing shorted pixels.

As will be appreciated from consideration of FIGS. 3-8 below, in some embodiments, screening as explained above may be performed on fewer than all of the arrays of a given die. For example, for die containing multiple arrays and that will have less than all of the arrays in use in a particular application, screening may conclude after one of the arrays is determined to have a suitable operational status for use. It will also be appreciated that more than one array of a particular die can have a suitable operational status for use.

Figure 2D:
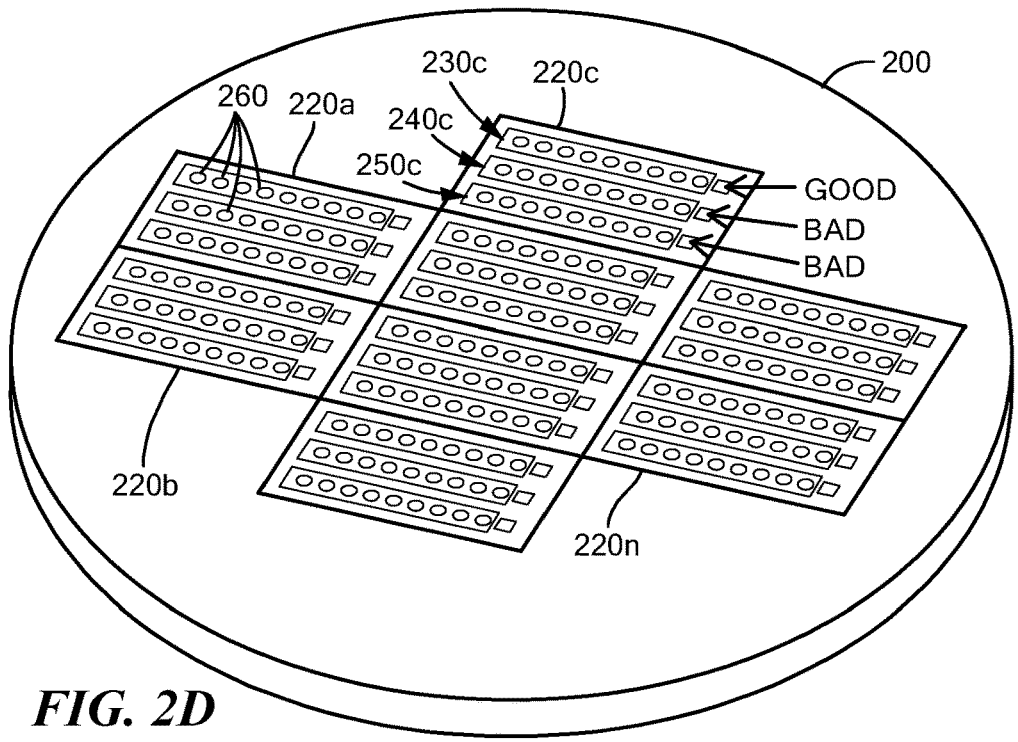
FIG. 2D shows example results of the screening of FIG. 2C.
Figure 2E:
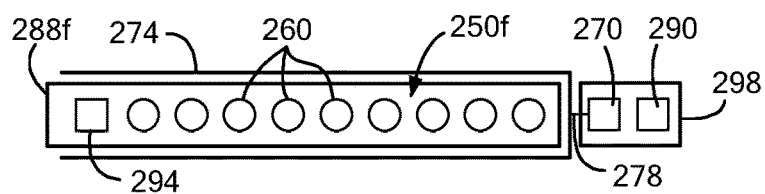
FIG. 2E is a detailed plan view of an array taken at an area labelled 2E-2E in FIG. 2C.

Referring also to FIG. 2D, example results of the detector array screening of die 220c are shown. Detector arrays 240c, 250c are, in the example, determined not to be fully functional (i.e., denoted as "BAD") and array 230c is determined to be fully functional (i.e., denoted as "GOOD"). Various techniques can be used to "mark" a fully functional array for use so that during assembly (e.g., FIG. 5), the assembler can readily identify an array for use. For example, a physical mark can be made on the die to identify the fully functional array, external tracking can be used, or the conductive layer on only fully functional arrays can be removed as explained below.

Following screening and determination of which array(s) of which die are fully functional, conductive layers 280a-280n, 284a-284n, 288a-288n associated with fully functional arrays that will be used in an application following dicing of the wafer 200 into die 220a-220n can be removed. Other conductive layers can be left intact or removed. More particularly, it may be desirable to leave the conductive layer intact on arrays determined not to be fully functional in order to prevent such arrays from generating electrical signals where the arrays are known not to be fully functional, since such electrical signals can be less accurate for processing purposes. In other words, leaving the conductive layer intact on arrays that are not fully functional ensures that the array will be fully inactive, or disabled.

For example, if it is desired to remove conductive layers 280a-280n, 284a-284n, 288a-288n from an entire wafer, the entire wafer can be placed into a chemical solution, or etchant, such as an acid solution, or a basic solution which may include other chemicals that attacks the conductive layer and then rinsing it off.

On the other hand, if it is desired to selectively remove conductive layers 280a-280n, 284a-284n, 288a-288n from only certain arrays, selective removal can be accomplished by using photolithography to pattern prior to the etch that removes the conductive material. For example, patterning can be accomplished with photolithography using an etch mask that has been customized to the screening data for a particular wafer. However, such etch patterning would likely be performed in a foundry setting that uses stepper-type mask aligners and could introduce an undesirable pause in the process flow and require customized mask design and fabrication.

Another technique that can be used for selective removal of conductive layers is laser cutting, or etching in order to electrically disconnect the conductive layer from the detector terminals 260. In other words, laser cutting in this fashion can be used to remove a piece or pieces of metal or a portion or portions of the conductive layer and result in an open circuit. The metal "cuts" can be programmed into a laser so that mask and etch steps are not required.

In situations where the yield of 100% operable arrays is low, the above-described screening methodology can effectively bring the yield of usable array die up to nearly 100%, thereby recovering array yield relative to conventional one-array-per-die manufacturing. Further, by forming identical arrays on otherwise unused area, the economic value of unused wafer and die area.

Referring also to FIG. 2E, optional additional detail of an example array 220f in an area labelled 2E-2E in FIG. 2C is shown. A ring contact 274 can be formed just outside the perimeter of the detector active area and rest on the common cathode layer of the wafer 200. The ring contact 274 can be routed by a metal trace 278 to cathode bump pad 270 positioned to the side of the pixel array. A specialized cathode continuity pad 290 can be electrically coupled to the pad 270 by a conductive layer 298, as shown. With this configuration, the common cathode can be probed at the specialized pad 290 (i.e., probe 62 can be brought into contact with continuity pad 290). Further, a specialized continuity pad 294 can be provided with which electrical connection can be made to the second terminal of the detectors 260 that are electrically connected together by the conductive layer 288f. Thus, the second terminal, or anode of the detectors 260 can be probed at the specialized pad 294 (i.e., probe 60 can be brought into contact with continuity pad 294).

Use of specialized pads 294, 290 that are positioned outside of the active area of the array and configured to be contacted by probes 60, 62, respectively, enables array screening without directly probing the relatively delicate bump pads of the detectors 260. In this way, advantageously, probe damage to pads 260, 270 that are needed to interconnect the array to a photoreceiver circuit, or other circuit can be avoided. Damaged detector bump pads can cause open connections when a detector array is later coupled to a photoreceiver circuit.

Figure 3:
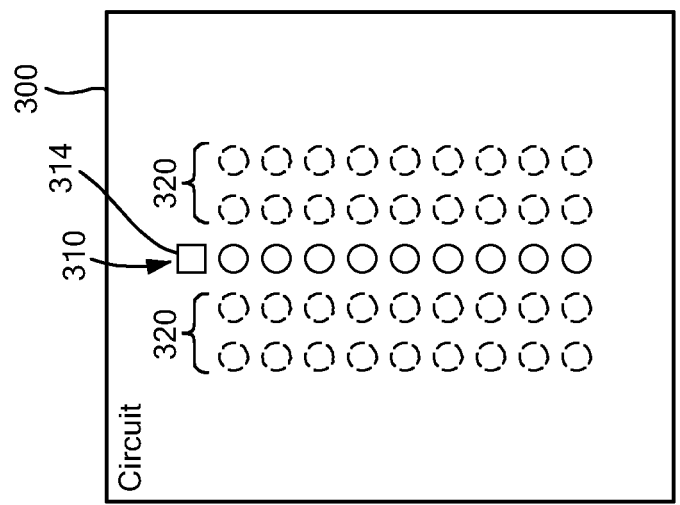
FIG. 3 shows an example photoreceiver circuit.

FIG. 3 shows an example photoreceiver circuit 300. Circuit 300 can be a Read Out Integrated Circuit (ROIC), Application Specific Integrated Circuit (ASIC), or any other form of circuit configured to electrically interface with a photodetector array and process light incident on the detector array. In some embodiments, photoreceiver circuit 300 can be interchangeably referred to as ROIC 300.

ROIC 300 includes a plurality of electrical contacts 310 arranged in a pattern configured to align with detectors of an array intended for use with the ROIC to form a photoreceiver. Thus, electrical contacts 310 are configured in a pattern compatible with respect to a detector pattern of the detector array intended to be electrically connected to the ROIC 300 in use. In the example embodiment, contacts 310 are provided in a 1×9 dimensional pattern. A ROIC contact 314 can be configured to be electrically connected to a common contact (e.g., cathode connection) of a compatible detector array.

Additional contacts 320 are illustrated with dotted line circles and can be provided to enhance mechanical stability and strength of the resulting photoreceiver. Contacts 320 are not intended for electrical connection to the detector array and thus, can be referred to as dummy contacts. To this end, contacts 320 are configured in a pattern compatible with respect to a detector pattern of the detector array intended to be electrically connected to the ROIC 300 in use. In the example embodiment, contacts 320 are in multiple 1×9 dimensional patterns.

Figure 4:
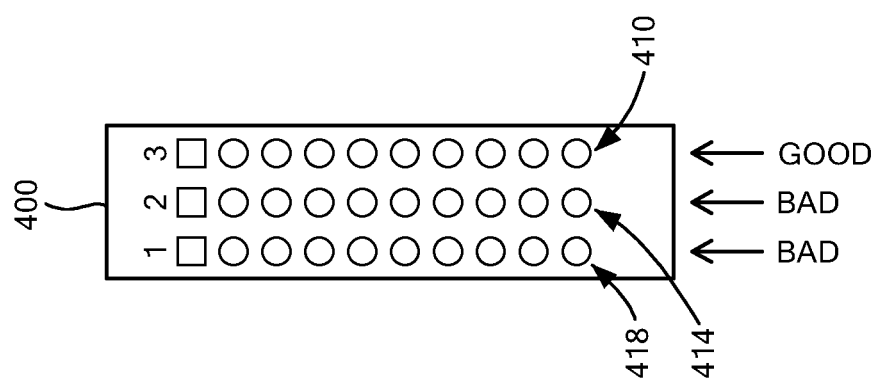
FIG. 4 shows a detector array die having a detector array selected according to the screening results of FIG. 2D.

FIG. 4 shows an example detector array die 400 suitable for use with the ROIC 300 of FIG. 3. Detector array die 400 can take the form of a semiconductor die of the type described above in connection with FIGS. 2A-2E. For example, detector array die 400 can be provided by screened die 220c of FIG. 2C and include a first array 410 determined to be fully functional (i.e., denoted as "GOOD") and two additional arrays 414, 418 determined not to be fully functional (i.e., denoted as "BAD"). Detector array die 400 is shown to have the conductive layer (that was used for screening as explained above) removed. Further, die 400 is shown without the specialized probe pads (e.g., pads 290, 294) for simplicity of illustration.

Figure 5:
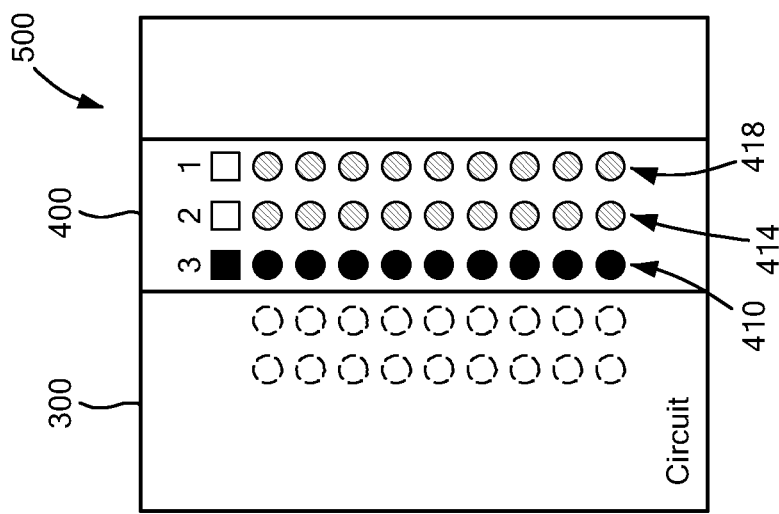
FIG. 5 shows a focal plane array including the circuit of FIG. 3 and the detector array of FIG. 4.

Referring also to FIG. 5, a photoreceiver, or Focal Plane Array (FPA) 500 includes ROIC 300 of FIG. 3 and detector array die 400 of FIG. 4. In particular, detector array die 400 is inverted, or flipped over (with respect to the view of FIG. 4) and aligned with ROIC 300 such that the bond pads of the fully functional array 410 are aligned with the ROIC electrical contacts 310. In this position, the detector array 410 is electrically connected to the ROIC contacts 310, such as by a solder process, in order to form a one-dimensional FPA 500.

In use, data from pixels of array 410 is processed by ROIC 300 and/or by external circuitry and systems external to the FPA 500 (not shown). It is understood that aspects of the disclosure are applicable to a wide range of application systems in which detector array yield and wafer/die space use are considerations.

Bump pads of non-fully functional arrays 414, 418 can be secured to dummy contacts 320 as shown, as may also be accomplished in the solder process in order to enhance the mechanical stability of the resulting FPA 500.

It will be appreciated that ROIC contacts 310, 320 are arranged to permit variable placement of the detector array die 400 in order to accommodate the screening results. In other words, if the results of the screening were that array 414 were good and arrays 410, 418 were bad, then the detector die 400 could be shifted left with respect to the view of FIG. 5 so that good array 414 were aligned with ROIC electrical contacts 310.

Given the example FPA 500, it will be appreciated that screening of detector array die 400 as explained above may be performed on fewer than all of the arrays 410, 414, 418 since only a single one of the arrays is electrically connected to the ROIC 300. For example, if detector arrays 410, 414, 418 are screened in this order, then screening may be concluded after the first screened array 410 is determined to be fully functional.

Figure 6:
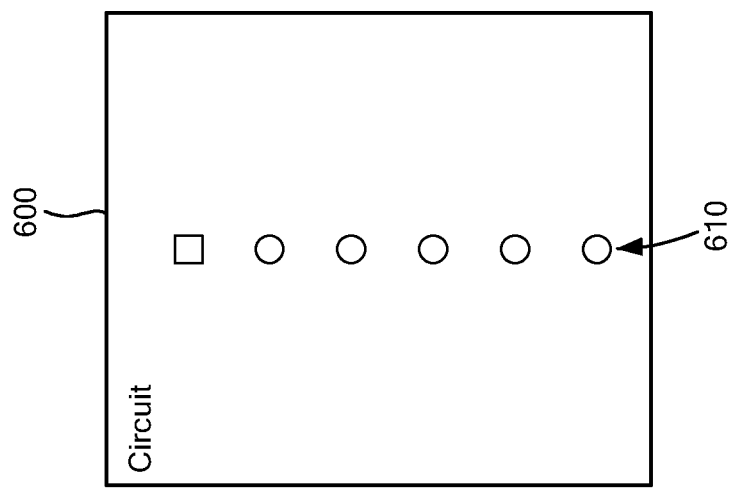
FIG. 6 shows an alternative example photoreceiver circuit.

Referring to FIG. 6, an alternative example photoreceiver circuit 600 can take the form of a ROIC or ASIC for example and is referred to herein as ROIC 600.

ROIC 600 includes a plurality of electrical contacts 610 arranged in a pattern configured to align with detectors of an array intended for use with the ROIC to form a photoreceiver. In the example embodiment, contacts 610 are in a 1×5 dimensional pattern.

Figure 7:
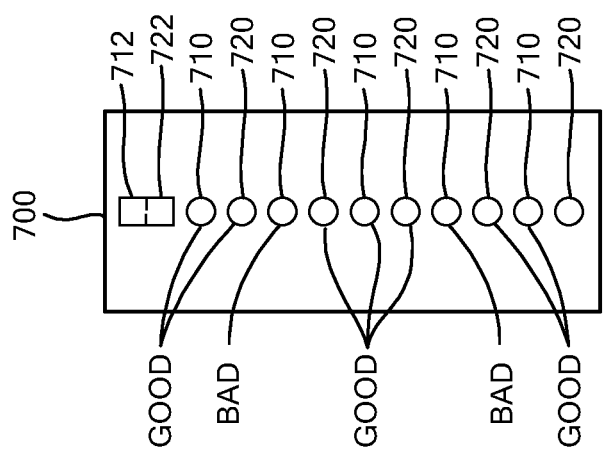
FIG. 7 shows an alternative example detector array die having a detector array selected according to screening results.

FIG. 7 shows an example detector array 700 suitable for use with the ROIC 600 of FIG. 6. Detector array 700 can take the form of a semiconductor die having a plurality of identical arrays, each including non-adjacent detectors. For example, a first array 710 can include detectors denoted by reference character 710 and a second array 720 can include detectors denoted by reference character 720. Each detector array 710, 720 can have a dedicated pad 712, 722 through which contact can be made to a common contact between the second terminals of each of the detectors in the array.

Screening the arrays 710, 720 can be the same as or similar to the screening methodology as explained above, whereby a conductive layer is applied to each array 710, 720 in order to electrically connect second terminals of the array detectors (e.g., anodes) where first terminals of the detectors (e.g., cathodes) are connected at the common cathode connection. It will be appreciated that, given the interleaved nature of arrays 710, 720, the respective conductive layers associated with each such array can have a comb shape with interleaved but non-contacting (i.e., electrically isolated) teeth. Although such conductive layers have patterns that may be more complex than for the simpler arrays of FIGS. 1-5, such patterning is feasible particularly when the plurality of arrays supported by a wafer are identical.

Results of screening detector arrays 710, 720 are also shown in FIG. 7 whereby fully functional detectors are labeled "GOOD" and detectors that are not fully functional are labeled "BAD." With these results, it can be determined that detector array 720 includes all "GOOD" elements whereas detector array 710 does not. As such, detector array 720 can be selected for use.

Figure 8:
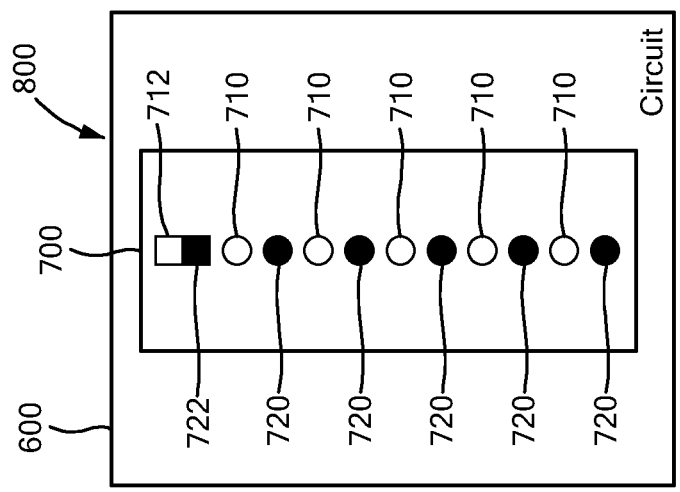
FIG. 8 shows a focal plane array including the circuit of FIG. 6 and the detector array of FIG. 7.

Referring also to FIG. 8, a photoreceiver, or Focal Plane Array (FPA) 800 includes ROIC 600 of FIG. 6 and detector array 700 of FIG. 7. In particular, detector array 700 is inverted, or flipped over (with respect to the view of FIG. 7) and aligned with ROIC 600 such that the bond pads of fully functional array 720 are aligned with the ROIC electrical contacts 610. In this position, the detector array 720 is electrically connected to the ROIC contacts 610, such as by a solder process, in order to form a one-dimensional FPA 800. In use, data from pixels of array 720 is processed by ROIC 600 and/or by external circuitry and systems external to the FPA 800 (not shown).

It will be appreciated that ROIC contacts 610 are arranged to permit variable placement of the detector array die 700 in order to accommodate the screening results. For example, if the results of the screening were that array 710 were good and array 720 were bad, then the detector die 700 could be shifted down with respect to the view of FIG. 8 so that the fully functional array is aligned with ROIC electrical contacts 610.

Figure 9A:
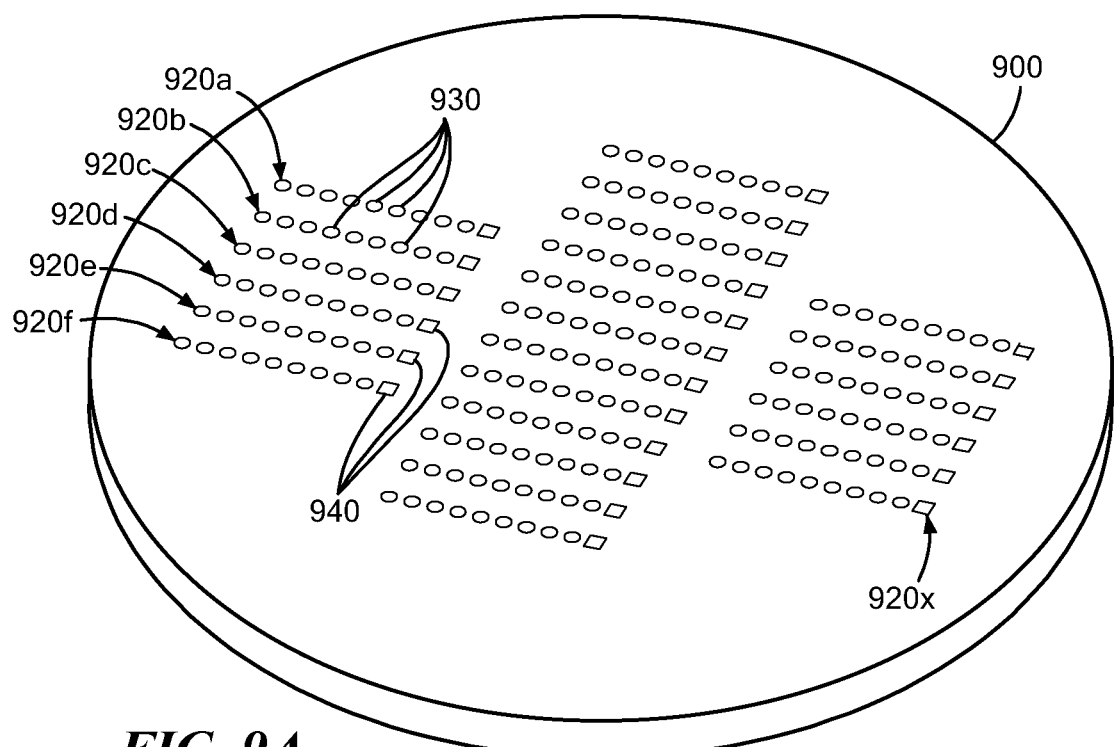
FIG. 9A shows a semiconductor wafer supporting an alternative plurality of identical detector arrays.

Referring to FIG. 9A, a further example semiconductor wafer 900 supports a plurality of detector arrays 920a-920x. Each of arrays 920a-920x contains a plurality of detector elements, or simply detectors 930. Detectors 930 can be the same as or similar to detectors 30 (FIGS. 1A-1E) or 260

(FIGS. 2A-2E) and are arranged in a pattern designed to suit needs of a particular application (e.g., a particular ROIC). Thus, each detector 930 of each of the arrays 920a-920x has a first terminal and a second terminal and, within each array, the first terminal of each detector is coupled together at a common contact 940.

Wafer 900 differs from the above-described wafers (wafer 10 of FIGS. 1A-1E and wafer 200 of FIGS. 2A-2E) in that the resulting die are not predefined. Rather, the ultimate definition of die resulting from dicing the wafer 900 is determined based on screening the plurality of detector arrays 920a-920x and, more particularly, based on which detector array pattern provides the best yield to suit the particular application, as will be explained. Thus, according to the embodiment of FIGS. 9A-9D, selecting one of the plurality of arrays for use includes defining a boundary of a die based on the determination of the operational status of each of the plurality of arrays 920a-920x.

Example arrays 920a-920x are 1×9 arrays. However, it will be appreciated by those of ordinary skill in the art that detector arrays 920a-920x can have various patterns and dimensions to suit a particular application.

Figure 9B:
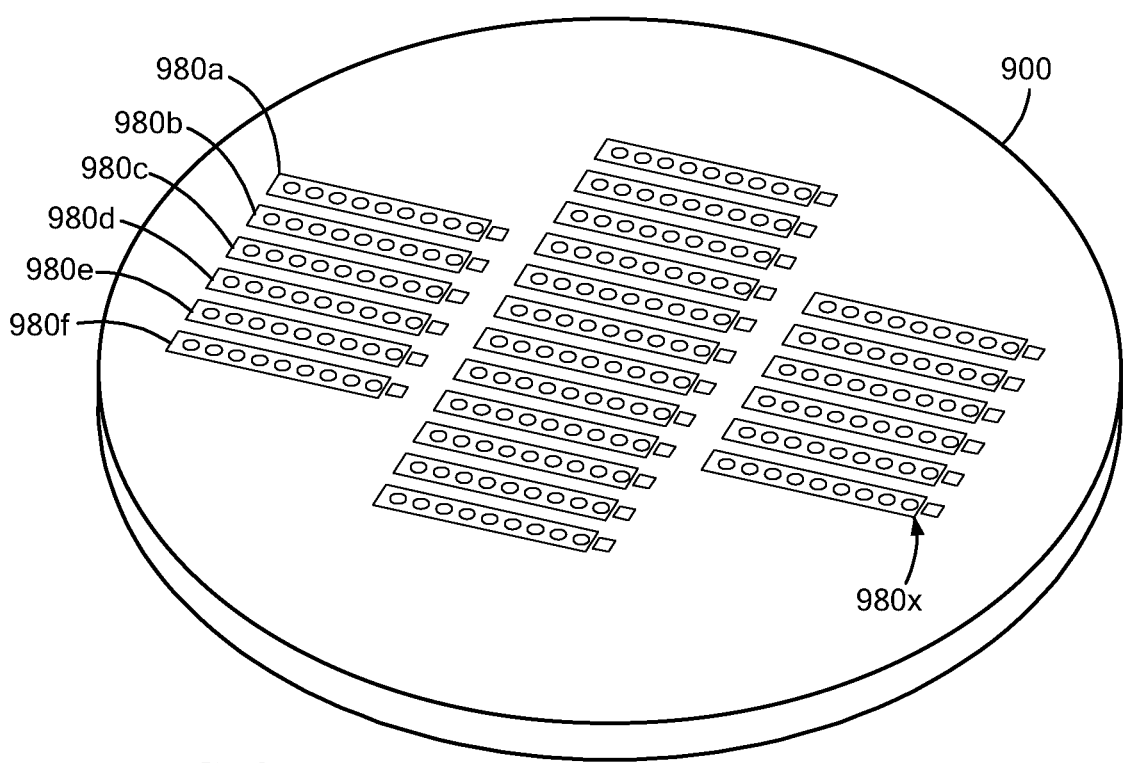
FIG. 9B shows the semiconductor wafer of FIG. 9A with a conductive layer applied to each of the detector arrays.

FIG. 9B illustrates the semiconductor wafer 900 of FIG. 9A with a conductive layer 980a-980x, applied to each detector array 920a-920x, respectively. For each array, conductive layer 980a-980x serves to couple the detectors 930 in parallel by electrically connecting second terminals of the detectors together, given that first terminals of the detectors are electrically coupled together by the common contact.

Figure 9C:
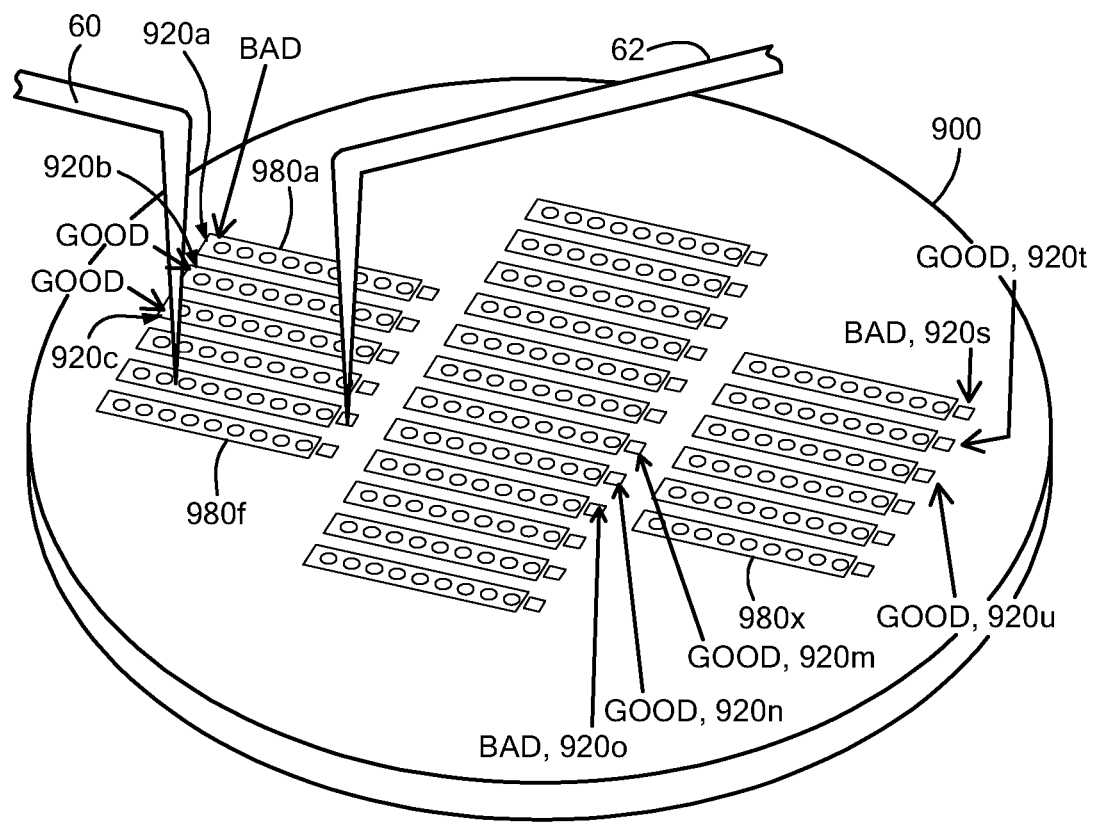
FIG. 9C illustrates screening of the detector arrays of FIG. 9B and example results of the screening.

Referring also to FIG. 9C, screening of arrays 920a-920x can be performed in the manner described above. To this end, for each array to be screened, probe 60 can be brought into electrical contact with the respective conductive layer 980a-980x and probe 62 can be brought into electrical contact with the common contact that electrically couples the first terminal of the detectors of the screened array together. It will be appreciated by those of ordinary skill in the art that although probe 60 is shown in contact with conductive layer 980e, additional detail (not shown in FIGS. 9A-9D) can include a specialized continuity pad with which electrical contact can be made to the detectors of the array and/or a specialized continuity pad with which electrical contact can be made to the common contact, as described above in connection with FIG. 2E. Such specialized continuity pads would eliminate the need to bring probe 60 into physical contact with the conductive layer 980e and probe 62 into physical contact with common contact pad 940.

An impedance measurement can be made with which the operational status of the array can be determined as explained above. FIG. 9C illustrates example screening results with arrays 920b, 920c, 920m, 920n, 920t, 920u having been determined to be fully functional and arrays 920a, 920o, 920s having been determined to be faulty.

Figure 9D:
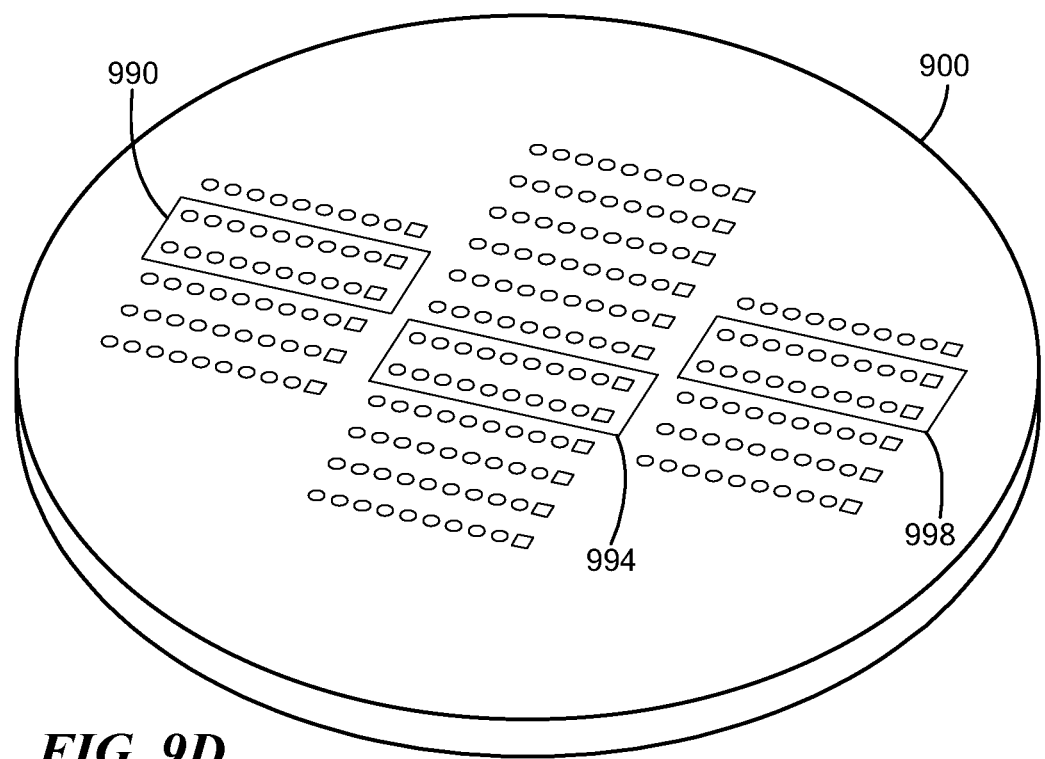
FIG. 9D illustrates die formed from the semiconductor wafer of FIG. 9A based on the screening results of FIG. 9C.

Referring also to FIG. 9D, having determined the operational status of the arrays 920a-920x, die can be defined based on the screening results and on the desired array use. For example, in an application requiring a 2×9 detector array, die 990, 994, and 998 can be defined as such die contain only fully functional arrays.

Although FIG. 9D illustrates each of the conductive layers 980a-980x having been removed, as explained above, in some embodiments, conductive layers can be left intact on arrays that are not fully functional in order to keep such not fully functional arrays inactive in applications in which non fully functional arrays are included in the die for mechanical purposes (e.g., to be attached to dummy contacts of a ROIC or ASIC).

With the methodology presented in connection with FIGS. 9A-9D, detector array yield and wafer area can be optimized by defining die based on detector array screening results. In other words, die boundary are dynamically determined in order to maximize use of fully functional arrays.

Figure 10:
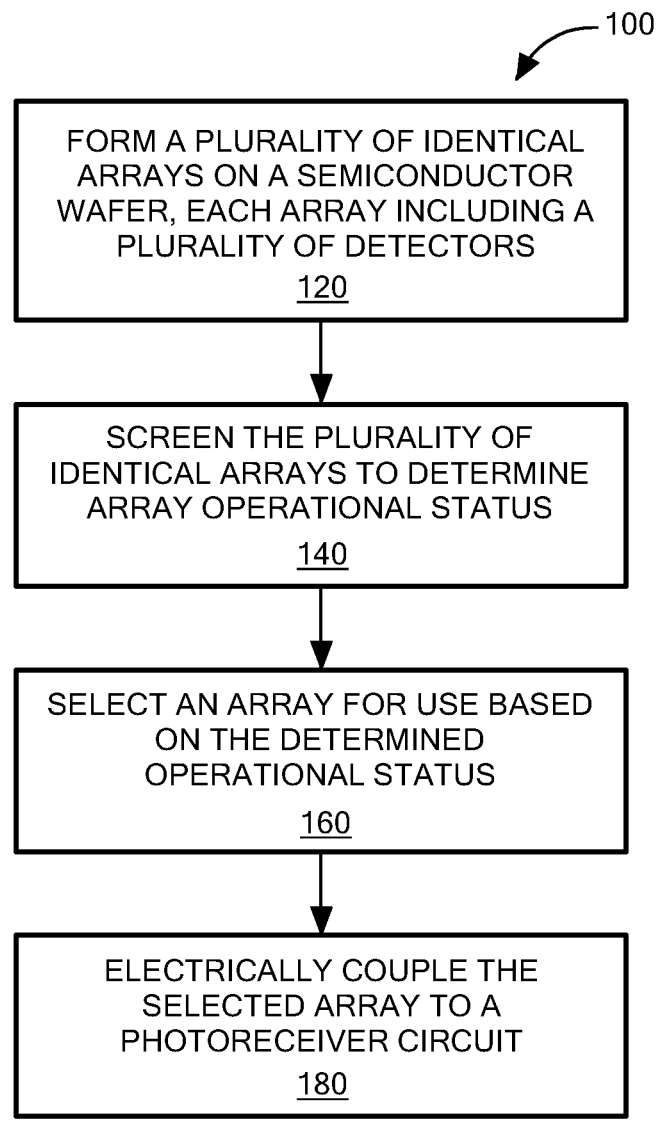
FIG. 10 is a flow diagram showing example steps for recovering detector array yield relative to conventional one-array-per-die manufacturing.

FIG. 10 is a flow diagram showing an example method 100 for recovering detector array yield relative to conventional one-array-per-die manufacturing. At block 120, a plurality of identical detector arrays are formed on a semiconductor wafer with each array including a plurality of detectors (e.g., identical arrays 230a, 240a, 250a of FIGS. 2A-2E).

At block 140, the arrays are screened to determine operational status. As explained above, screening of an array can be achieved by applying a conductive layer to the array to electrically connect each of the detectors of the array in parallel. A first probe can be brought into electrical contact to the conductive layer and a second probe can be brought into electrical contact with a common contact of the detectors, such as a cathode contact. Specialized continuity pads can be used for this purpose as explained in connection with FIG. 2E for example. Operational status of the array can be determined by measuring impedance between the first and second probes in order to thereby determine if any of the detectors are shorted. In this way, a determination is made as to whether the array is or is not fully functional (e.g., whether the array does not contain any shorted detectors or whether the array contains one or more shorted detectors, respectively).

An array is selected for use based on the determined operational status at block 160. At block 180, the selected array is electrically coupled to a photoreceiver circuit. For example, with reference to FIGS. 3-5, fully functional array 410 can be electrically coupled to electrical contacts 310 of ROIC 300 to form focal plane array 500.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   forming a plurality of identical arrays on a semiconductor wafer, each array comprising a plurality of detectors;
   screening each of the plurality of arrays to determine an operational status of each of the plurality of arrays; and
   selecting one of the plurality of arrays for use based on the determination of the operational status of the plurality of arrays.

2. The method of claim 1, wherein the operational status of each of the plurality of arrays is a fully functional status or a not fully functional status.

3. The method of claim 1, wherein the detectors of each of the plurality of arrays comprise one or more photodiodes, photoconductors, or avalanche photodiodes.

4. The method of claim 1, further comprising electrically coupling the selected array to a Read Out Integrated Circuit (ROIC) or an Application Specific Integrated Circuit (ASIC).

5. The method of claim 4, wherein electrically coupling comprises positioning the selected array relative to the ROIC or ASIC so that the plurality of detectors of the selected array contact a plurality of contacts of the ROIC or ASIC.

6. The method of claim 4, further comprising coupling at least a portion of an array that is not the selected array to one or more dummy contacts of the ROIC or ASIC.

7. The method of claim 1, wherein each of the plurality of identical arrays is a one-dimensional array.

8. The method of claim 7, wherein each of the plurality of identical arrays comprises non-adjacent detectors.

9. The method of claim 1, wherein each detector of each of the plurality of arrays has a first terminal and a second terminal, wherein, within each array, the first terminal of each detector is coupled together at a common contact, and wherein screening each of the plurality of arrays comprises, for each array:
   applying a conductive layer to the array to electrically connect the second terminal of each of the plurality of detectors of the array together;
   electrically contacting the conductive layer with a first probe;
   electrically contacting the common contact with a second probe; and
   measuring an impedance between the first probe and the second probe to determine the operational status of the array.

10. The method of claim 9, wherein the common contact comprises a cathode contact.

11. The method of claim 9, wherein the conductive layer comprises titanium.

12. The method of claim 9, further comprising removing the conductive layer from the array if the operational status is determined to be fully functional.

13. The method of claim 12, wherein removing the conductive layer from the array comprises laser cutting the conductive layer.

14. The method of claim 9, further comprising leaving the conductive layer intact on the array if the operational status is determined to be non-fully functional.

15. The method of claim 1, wherein selecting one of the plurality of arrays for use comprises defining a boundary of a die based on the determination of the operational status of each of the plurality of arrays, wherein the selected one of the plurality of arrays is supported by the die.

16. Apparatus comprising:
   a circuit comprising a plurality of electrical contacts; and
   a semiconductor wafer comprising a plurality of identical arrays, each including a plurality of detectors, wherein the plurality of identical arrays comprises at least one selected array that is fully functional and at least one non-selected array that is not fully functional, and wherein the selected array is positioned with respect to the circuit so that the detectors of the selected array contact the plurality of electrical contacts of the circuit.

17. The apparatus of claim 16, wherein the circuit comprises a ROIC or an ASIC.

18. The apparatus of claim 16, wherein the detectors of each of the plurality of arrays comprise one or more photodiodes, photoconductors, or avalanche photodiodes.

19. The apparatus of claim 16, wherein the circuit comprises one or more dummy contacts and wherein at least a portion of an array that is not the selected array is coupled to the one or more dummy contacts of the circuit.

20. The apparatus of claim 16, wherein each of the plurality of identical arrays is a one-dimensional array.

21. The apparatus of claim 16, wherein each of the plurality of identical arrays comprises non-adjacent detectors.

22. The apparatus of claim 16, wherein the selected array defines a boundary of a die supporting the selected array.

23. A focal plane array comprising:
   a circuit comprising a plurality of electrical contacts; and
   a die comprising a plurality of identical arrays, each including a plurality of detectors, wherein the plurality of identical arrays comprises at least one selected array that is fully functional and at least one non-selected array that is not fully functional, and wherein the selected array is positioned with respect to the circuit so that the detectors of the selected array contact the plurality of electrical contacts of the circuit.

24. The focal plane array of claim 23, wherein the circuit comprises a ROIC or an ASIC.

25. The focal plane array of claim 23, wherein the detectors of each of the plurality of arrays comprise one or more photodiodes, photoconductors, or avalanche photodiodes.

26. The focal plane array of claim 23, wherein the circuit comprises one or more dummy contacts and wherein at least a portion of an array that is not the selected array is coupled to the one or more dummy contacts of the circuit.

27. The focal plane array of claim 23, wherein each of the plurality of identical arrays is a one-dimensional array.

28. The focal plane array of claim 23, wherein each of the plurality of identical arrays comprises non-adjacent detectors.

* * * * *

UNITED STATES PATENT AND TRADEMARK OFFICE
CERTIFICATE OF CORRECTION

PATENT NO. : 11,600,654 B2
APPLICATION NO. : 17/376607
DATED : March 7, 2023
INVENTOR(S) : Logan G. Stewart et al.

It is certified that error appears in the above-identified patent and that said Letters Patent is hereby corrected as shown below:

In the Specification

Column 1, Line 22 delete "as a focal" and replace with --as focal--.

Column 6, Line 5 delete "Weaker" and replace with --weaker--.

Column 6, Line 21 delete ", -segmented" and replace with --, segmented--.

Column 7, Line 14 delete "system" and replace with --systems--.

Column 7, Line 62 delete "multiple-thresholds" and replace with --multiple thresholds--.

Column 10, Line 38 delete "die 20a and 20n" and replace with --die 40a and 40n--.

Column 14, Line 31 delete "die area." and replace with --die area is recovered--.

Column 14, Line 33 delete "220ƒ" and replace with --250ƒ--.

Signed and Sealed this
Twenty-sixth Day of December, 2023

Katherine Kelly Vidal
*Director of the United States Patent and Trademark Office*